(12) United States Patent
Lee et al.

(10) Patent No.: US 10,896,711 B2
(45) Date of Patent: Jan. 19, 2021

(54) MEMORY DEVICE WITH MEMORY CELL STRUCTURE INCLUDING FERROELECTRIC DATA STORAGE LAYER, AND A FIRST GATE AND A SECOND GATE

(71) Applicant: Samsung Electronics Co., Ltd., Suwon-si (KR)

(72) Inventors: Kyung Hwan Lee, Hwaseong-si (KR); Seung Hyun Kim, Seoul (KR); Yong Seok Kim, Suwon-si (KR); Jun Hee Lim, Seoul (KR); Kohji Kanamori, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/522,121

(22) Filed: Jul. 25, 2019

(65) Prior Publication Data
US 2020/0202916 A1   Jun. 25, 2020

(30) Foreign Application Priority Data

Dec. 21, 2018   (KR) ........................ 10-2018-0167171

(51) Int. Cl.
*G11C 11/22* (2006.01)
*H01L 27/11585* (2017.01)

(52) U.S. Cl.
CPC ............ *G11C 11/223* (2013.01); *G11C 11/22* (2013.01); *G11C 11/2255* (2013.01); *G11C 11/2257* (2013.01); *H01L 27/11585* (2013.01)

(58) Field of Classification Search
CPC .............. G11C 16/0483; G11C 11/223; G11C 11/2255; G11C 11/2257; H01L 27/11585
See application file for complete search history.

(56) References Cited

U.S. PATENT DOCUMENTS

| | | | |
|---|---|---|---|
| 8,385,098 B2 | 2/2013 | Hong et al. | |
| 8,513,731 B2 | 8/2013 | Lee et al. | |
| 9,070,446 B1* | 6/2015 | Aritome | G11C 5/02 |
| 9,281,044 B2 | 3/2016 | Ramaswamy et al. | |
| 9,502,471 B1 | 11/2016 | Lu et al. | |
| 9,530,794 B2* | 12/2016 | Ramaswamy | H01L 27/11597 |
| 9,947,407 B2 | 4/2018 | Nguyen et al. | |
| 10,043,580 B2 | 8/2018 | Nam et al. | |
| 10,210,921 B1* | 2/2019 | Hwang | G11C 11/2255 |
| 2006/0138504 A1* | 6/2006 | Kang | H01L 27/1159 257/295 |

(Continued)

*Primary Examiner* — Mushfique Siddique
(74) *Attorney, Agent, or Firm* — Muir Patent Law, PLLC

(57) ABSTRACT

A memory device includes memory cells, the memory cells each including a first gate, a second gate electrically isolated from the first gate, a first gate insulating layer including a data storage layer having a ferroelectric material and disposed between the first gate and a channel region, a second gate insulating layer disposed between the second gate and the channel region, a first switching cell connected between the memory cells and a source line, and a second switching cell connected between the memory cells and a bit line. The second switching cell includes a third gate, a fourth gate, a third gate insulating layer not including a data storage layer having the ferroelectric material and the third gate disposed between the third gate and the channel region, and a fourth gate insulating layer disposed between the fourth gate and the channel region.

18 Claims, 38 Drawing Sheets

(56) References Cited

U.S. PATENT DOCUMENTS

| | | | |
|---|---|---|---|
| 2007/0158731 A1* | 7/2007 | Bae | G11C 11/22 |
| | | | 257/314 |
| 2007/0176218 A1* | 8/2007 | Kang | H01L 27/11502 |
| | | | 257/295 |
| 2008/0084745 A1* | 4/2008 | Walker | G11C 16/10 |
| | | | 365/185.17 |
| 2011/0075467 A1* | 3/2011 | Hong | H01L 27/1203 |
| | | | 365/145 |
| 2016/0118404 A1 | 4/2016 | Peng | |
| 2016/0181259 A1 | 6/2016 | Houdt et al. | |
| 2016/0254054 A1* | 9/2016 | Kang | H01L 27/11565 |
| | | | 365/185.11 |
| 2017/0278858 A1* | 9/2017 | Walker | H01L 27/1159 |
| 2019/0259778 A1* | 8/2019 | Yoo | G11C 5/025 |
| 2020/0090769 A1* | 3/2020 | Maeda | G11C 11/5657 |
| 2020/0294601 A1* | 9/2020 | Kwak | H01L 27/11582 |

* cited by examiner

III-III'

III-III'

MEMORY DEVICE WITH MEMORY CELL STRUCTURE INCLUDING FERROELECTRIC DATA STORAGE LAYER, AND A FIRST GATE AND A SECOND GATE

CROSS-REFERENCE TO RELATED APPLICATION(S)

This application claims benefit of priority to Korean Patent Application No. 10-2018-0167171 filed on Dec. 21, 2018 in the Korean Intellectual Property Office, the disclosure of which is incorporated herein by reference in its entirety.

BACKGROUND

1. Field

The present inventive concept relates to a memory device.

2. Description of Related Art

Memory devices may provide a function of recording and erasing data, or to read recorded data. Memory devices may be classified as nonvolatile memory devices and volatile memory devices. In the case of nonvolatile memory devices, data recorded in nonvolatile memory devices may be maintained even when power is turned off. As the types and fields of electronic devices to which memory devices are applied are various, a variety of research is progressing into improving an operating speed of a memory device and reducing power consumption. In general, data of a memory cell having a gate insulating layer using a high dielectric constant material may easily be changed by a voltage applied to the memory cell. As a result, electrical characteristics of a memory device including the memory cell may deteriorate.

SUMMARY

An aspect of the present inventive concept is to provide a memory device, in which a data storage layer of a memory cell includes a ferroelectric material, and a first gate and a second gate, controllable independently of one another, are provided in the memory cell, such that data may be recorded in a data storage layer or read from the data storage layer, without data loss and change.

According to an aspect of the present inventive concept, a memory device includes memory cells, the memory cells each including a first gate, a second gate electrically isolated from the first gate, a first gate insulating layer disposed between the first gate and a channel region and the second gate insulating layer disposed between the second gate and the channel region, wherein the first gate and the second gate share the channel region, and the first gate insulating layer includes a data storage layer having a ferroelectric material, the memory device including a first switching cell connected between the memory cells and a source line, the first switching cell including a first gate, a second gate, a first gate insulating layer disposed between the first gate of the first switching cell and the channel region, and a second gate insulating layer disposed between the second gate of the first switching cell and the channel region, wherein the first gate insulating layer of the first switching cell either includes a data storage layer having the ferroelectric material or does not include a data storage layer having the ferroelectric material, a second switching cell connected between the memory cells and a bit line, the second switching cell including a first gate, a second gate, a first gate insulating layer disposed between the first gate of the second switching cell and the channel region, and a second gate insulating layer disposed between the second gate of the second switching cell and the channel region, wherein the first gate insulating layer of the second switching cell does not include a data storage layer having the ferroelectric material, and a control circuit configured to control the memory cells, the first switching cell and the second switching cell.

According to an aspect of the present inventive concept, a memory device includes memory cells each including a first gate and a second gate separated from each other, a first switching cell connected between the memory cells and a source line, the first switching cell including a first gate and a second gate, a second switching cell connected between the memory cells and a bit line, the second switching cell including a first gate and a second gate, a data storage layer having a ferroelectric material disposed between the first gates of the memory cells and a channel region and between the first gate of one of the first switching cell and the second switching cell and the channel region, and a control circuit configured to determine at least one selected memory cell and unselected memory cells among the memory cells, and float the first gates of the unselected memory cells and the second gate of the at least one selected memory cell in a control operation with respect to the at least one selected memory cell. The data storage layer is not disposed between the first gate of the other of the first switching cell and the second switching cell and the channel region.

According to an aspect of the present inventive concept, a memory device includes first word lines stacked on an upper surface of a substrate and extending in a first direction, parallel to the upper surface of the substrate, second word lines stacked on the upper surface of the substrate and separated from the first word lines in a second direction parallel to the upper surface of the substrate, channel regions disposed between the first word lines and the second word lines, a string select line stacked above the first word lines and extending in the first direction, a ground select line stacked under the first word lines and extending in the first direction, a first gate insulating layer including a data storage layer having a ferroelectric material disposed between a first channel region of the channel regions and the first word lines and the first gate insulating layer extending in the first direction, and a second gate insulating layer disposed between the first channel region and the second word lines and extending in the first direction. The data storage layer is not disposed between either the string select line or the ground select line and the first channel region.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Hereinafter, example embodiments of the present inventive concept will be described with reference to the accompanying drawings.

Figure 1:
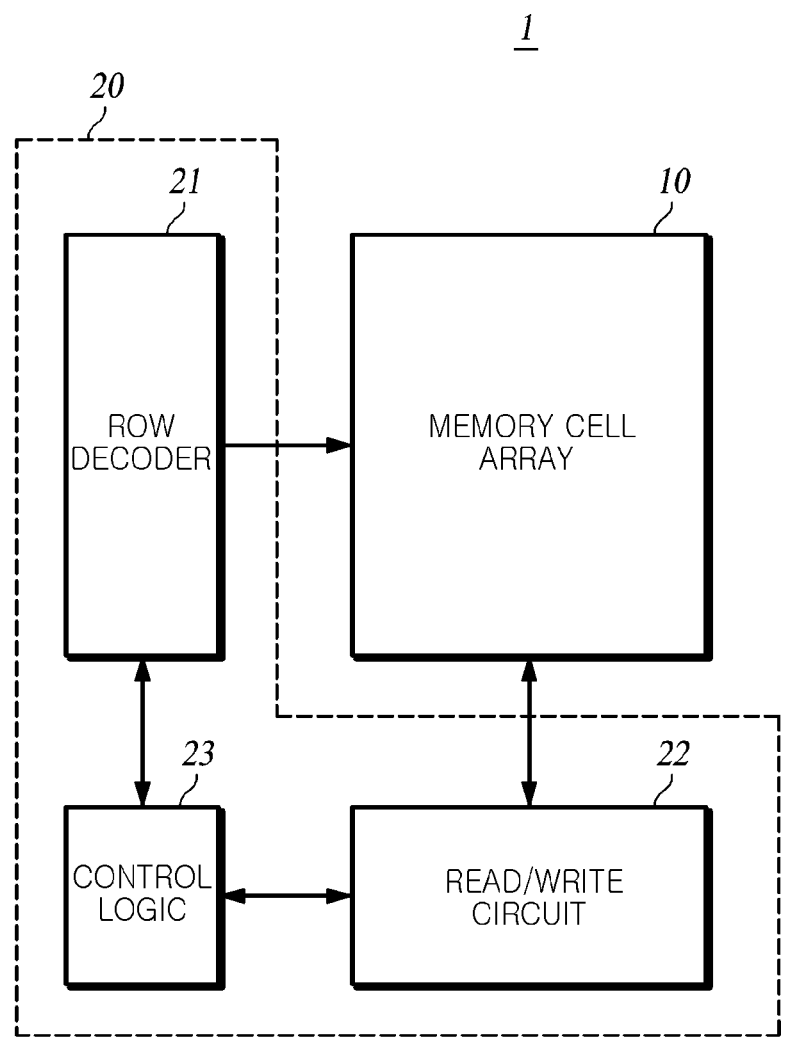
FIG. 1 is a schematic block diagram of a memory device according to an example embodiment of the present inventive concept.

FIG. 1 is a schematic block diagram of a memory device according to an example embodiment.

Referring to FIG. 1, a memory device 1 according to an example embodiment may include a memory cell array 10, a control circuit 20, and the like. The control circuit 20 may include a row decoder 21, a read/write circuit 22, a control logic 23, and the like.

The memory cell array 10 may include a plurality of memory cells arranged in a plurality of rows and columns. In an example embodiment, portions of the plurality of memory cells included in the memory cell array 10 may be connected to one another in series, to constitute a single memory cell string. The memory cell array 10 may include a plurality of memory cell strings, and each of the memory cell strings may include a first switching cell and a second switching cell, connected to both ends of memory cells, connected to each other in series. In an example embodiment, the first switching cell and the second switching cell may be a ground selection transistor and a string selection transistor, respectively. The memory cell strings may respectively be connected to the row decoder 21 via a word line WL, a common source line CSL, a string select line SSL, a ground select line GSL, or the like, and may respectively be connected to the read/write circuit 22 via a bit line BL.

In addition, the memory cells included in the memory cell array 10 may be divided into a plurality of memory blocks. Each memory block may include a plurality of word lines WL, a plurality of string select lines SSL, a plurality of ground select lines GSL, a plurality of bit lines BL and at least one common source line CSL.

The row decoder 21 may receive a control command from the control logic 23, and in an example embodiment, the control command may include address information. The row decoder 21 may determine a voltage supplied to at least a portion of the word line WL, the common source line CSL, the string select line SSL and the ground select line GSL, connected to the memory cell array 10, depending on the address information.

The read/write circuit 22 may select at least a portion of the bit lines BL connected to the memory cell array 10, depending on the control command received from the control logic 23. The read/write circuit 22 may read data stored in a memory cell connected to a selected bit line BL, or may write data to a memory cell connected to the selected bit line BL. The read/write circuit 22 may include a circuit such as a page buffer, an input/output buffer, a data latch, or the like, to perform the reading and writing operations as described above.

The control logic 23 may control operations of the row decoder 21 and the read/write circuit 22, while communicating with an external host or the like to receive or transmit data. The control logic 23 may control operations of the row decoder 21 to supply a read voltage to a selected word line WL connected to a memory cell in which data to be read is stored, in a reading operation performed to read the data stored in the memory cell of the memory cell array 10. In an example, the read voltage may be a voltage varying within a predetermined range. For example, when the read voltage is applied to the selected word line WL, the control logic 23 may control the read/write circuit 22 to read data from the memory cell connected to the selected word line WL.

In some examples, when executing a programming operation to write data to the memory cell array 10, the control logic 23 may control the operation of the row decoder 21 to supply a programming voltage to a selected word line WL connected to a memory cell to which data is to be written. When the programming voltage is supplied to the selected word line WL, the control logic 23 may control the read/write circuit 22 to write data to the memory cell connected to the selected word line WL.

In an example embodiment, the memory cell may include a data storage layer having a ferroelectric material. The memory cell may record or erase data, using a dipole polarity change of the data storage layer, generated by a voltage input to a gate. By using the data storage layer having a ferroelectric material, the memory device 1 may be operated with a relatively low operating voltage, and a high operating speed may be implemented.

Figure 2:
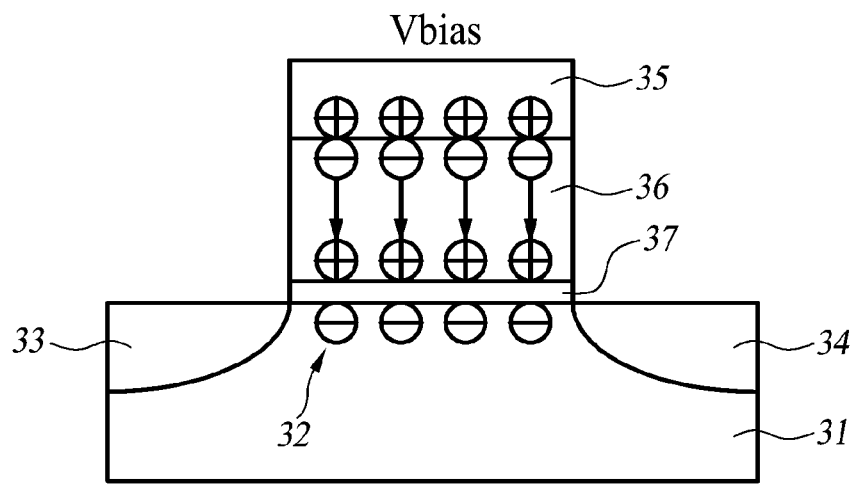
FIGS. 2 and 3 are views illustrating the operational principle of a memory cell included in a memory device according to example embodiments of the present inventive concept.
Figure 3:
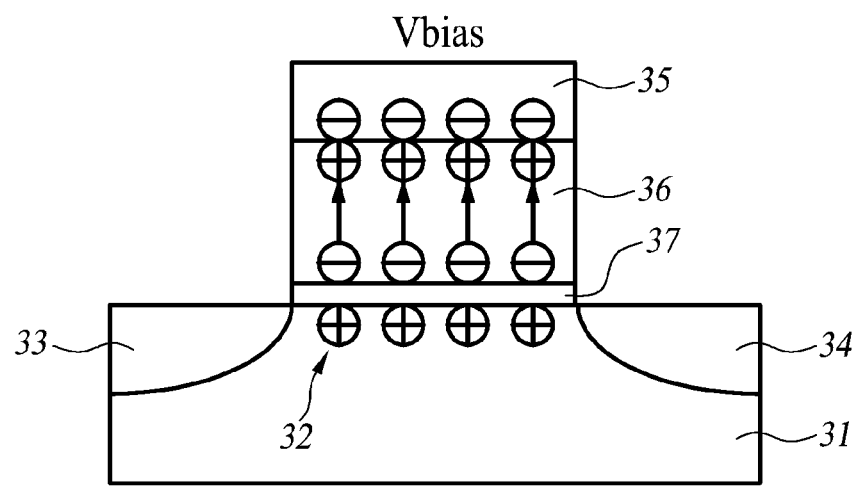

FIGS. 2 and 3 are views illustrating an operational principle of a memory cell included in a memory device according to example embodiments.

Referring to FIGS. 2 and 3, in a memory cell 30 according to an example embodiment, gate insulating layers 36 and 37 may be disposed between a channel region 32 provided in a semiconductor substrate 31 and a gate 35. In the case of the gate insulating layers 36 and 37, a data storage layer 36 having a ferroelectric material and a dielectric layer 37 may be included therein. The dielectric layer 37 may include a material different from that of the data storage layer 36.

When a predetermined bias voltage Vbias is input (i.e., applied) to the gate 35, a dipole polarity change may occur in the data storage layer 36. As illustrated in FIG. 2, when a positive bias voltage Vbias is input to the gate 35, charges may be concentrated in the channel region 32. Therefore, a current may easily flow between a source region 33 and a drain region 34, and a threshold voltage of the memory cell 30 may be reduced.

As illustrated in FIG. 3, when a negative bias voltage Vbias is input to the gate 35, charge may be removed from the channel region 32. Therefore, a current may not easily flow between the source region 33 and the drain region 34, and a threshold voltage of the memory cell 30 may be increased. Data may be written or erased by changing the threshold voltage of the memory cell 30 by inputting a voltage to the gate 35 as described with reference to FIGS. 2 and 3.

In an example embodiment, even in a case in which a relatively low bias voltage Vbias is input, a polarity change of dipole may start in the data storage layer 36 of the memory cell 30. Therefore, when a memory cell string is implemented using the memory cell 30, the data written to the memory cell 30 may be erased by a pass voltage input to the memory cell 30 for the reading operation or the programming operation, or unintentional data may be recorded.

Figure 4:
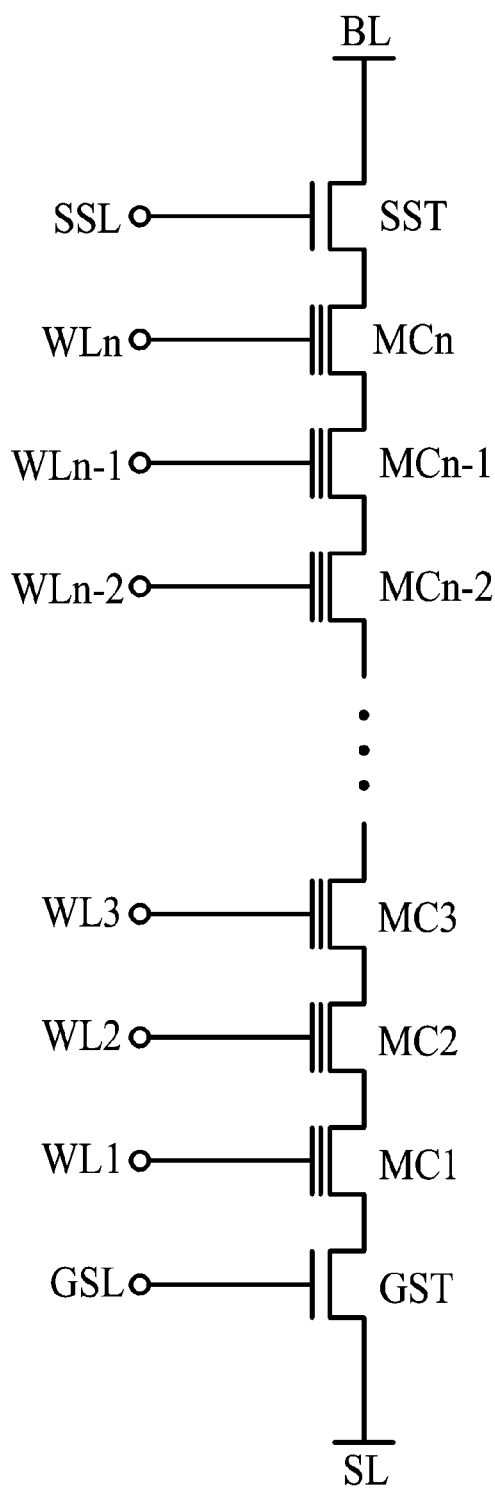
FIGS. 4 to 6 are diagrams illustrating the principle of operation of a memory device according to example embodiments of the present inventive concept.
Figure 5:
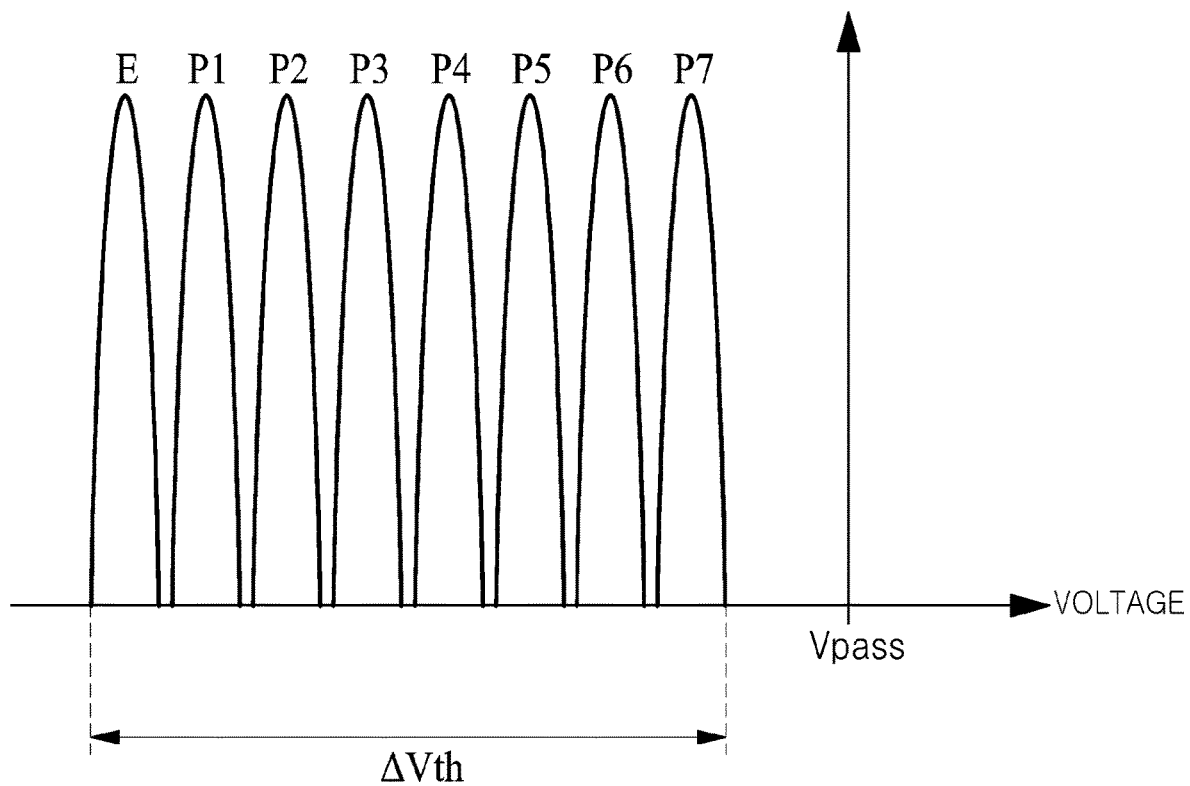
Figure 6:
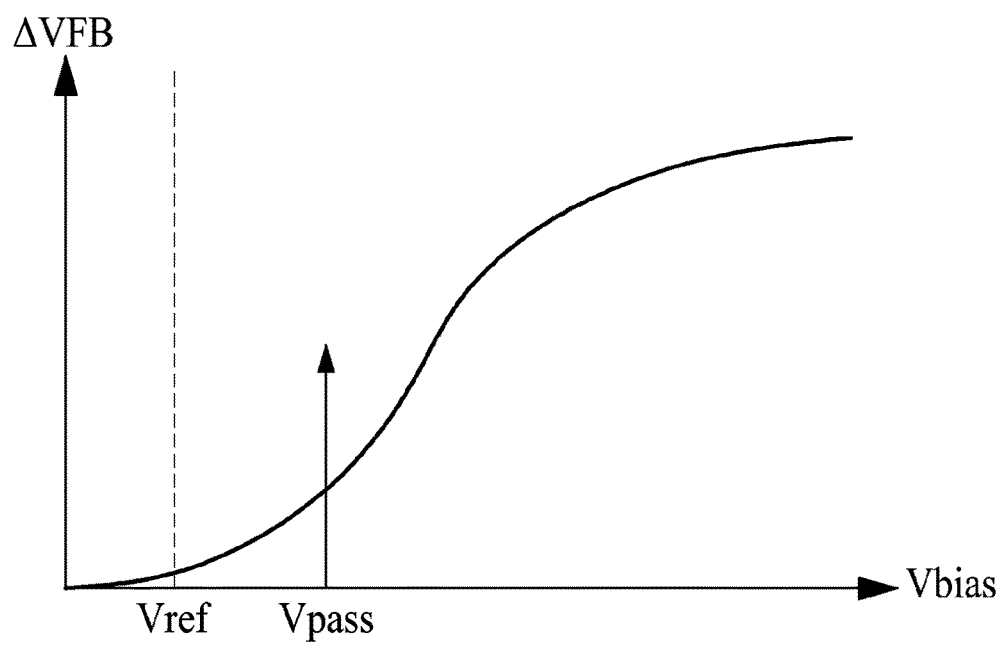

FIGS. 4 to 6 are diagrams illustrating a principle of operation of a memory device according to example embodiments.

Referring to FIG. 4, a memory device according to an example embodiment may include a plurality of memory cell strings. Each memory cell string 40 may include memory cells MC1 to MCn connected to each other in series. A first switching cell GST and a second switching cell SST may be connected to both ends of the memory cells MC1 to MCn connected to each other in series. The first switching cell GST may be connected between the memory cells MC1 to MCn and a source line SL, and the second switching cell SST may be connected between the memory cells MC1 to MCn and a bit line BL. Gates of the memory cells MC1 to MCn may be connected to word lines WL1 to WLn, a gate of the first switching cell GST may be connected to a ground select line GSL, and a gate of the second switching cell SST may be connected to a string select line SSL.

For example, when a selected memory cell and unselected memory cells are determined from the memory cells MC1 to MCn, voltages used for a control operation for the selected memory cell may be generated to be applied to the bit line BL, the source line SL, the word lines WL1 to WLn, the ground select line GSL and the string select line SSL. In an example, when the control operation is a reading operation, a read voltage may be input to the word line of the selected memory cell, and a pass voltage may be input to the word lines of the unselected memory cells. The unselected memory cells may be turned on by the pass voltage, and a current path may be formed to pass through a channel region shared by the memory cells MC1 to MCn.

When the control operation is a programming operation, a programming voltage may be input to the word line of the selected memory cell, and a pass voltage may be input to the word lines of the unselected memory cells. The pass voltage input to the unselected memory cells may have different magnitudes in the reading operation and the programming operation.

When the memory cells MC1 to MCn have the data storage layer formed of a ferroelectric material, a dipole polarity change may occur in the data storage layer due to the pass voltage, and data stored in unselected memory cells from the memory cells MC1 to MCn may be unintentionally changed. Therefore, for a stable operation of the memory cell string 40, a predetermined margin may be present between a threshold voltage distribution and a pass voltage of the memory cells MC1 to MCn for discrimination of data.

The graph illustrated in FIG. 5 may be a graph illustrating distributions of threshold voltages E to P7 and a pass voltage Vpass when the memory cell operates in a triple-level-cell (TLC) mode. In the case in which the memory cell has a data storage layer formed of a ferroelectric material, a magnitude of the pass voltage may be limited to prevent changing data of the unselected memory cell receiving the pass voltage, and all of the threshold voltage distributions E to P7 may be included within a relatively low threshold voltage difference ΔVth. Therefore, since a voltage width of each of the threshold voltage distributions E to P7 is reduced, the memory cell may not be stably operated.

A graph illustrated in FIG. 6 may be a graph illustrating a flatband voltage difference ΔVFB of the data storage layer with respect to the bias voltage Vbias input to a gate of the memory cell. Referring to FIG. 6, the flatband voltage difference ΔVFB starts to appear in a section in which the bias voltage Vbias is higher than a reference voltage Vref, and a dipole polarity change may start to occur in the data storage layer. On the other hand, since the pass voltage Vpass should be a voltage having a magnitude enough to turn on the memory cell or boost the channel region, the pass voltage may be higher than the reference voltage Vref. Thus, data of the memory cell may be unintentionally changed by the pass voltage Vpass.

To prevent the occurrence of such a problem, in an example embodiment of the present inventive concept, a first gate and a second gate capable of receiving different levels of voltages may be disposed on both sides of a channel region of the memory cell. A first gate insulating layer may be disposed between the first gate and the channel region, a second gate insulating layer may be disposed between the second gate and the channel region, and the first gate insulating layer may include a data storage layer formed of a ferroelectric material.

For example, when a memory cell is selected, a read voltage or a programming voltage for a reading operation or a programming operation may be input to the first gate of the selected memory cell, and the second gate of the selected memory cell may be a floating gate (e.g., no voltage input to the second gate). In some examples, the read voltage may be a ground voltage GND and the programming voltage Vpgm may be higher than a power supply voltage (e.g., VCC). Each of the first gates of unselected memory cells may be a floating gate and the pass voltage may be input to the second gates of the unselected memory cells. Since the pass voltage is input to the second gates of the unselected memory cells, the data of the data storage layer included in the first gate insulating layer of the unselected memory cells may be prevented from being unintentionally changed.

Figure 7:
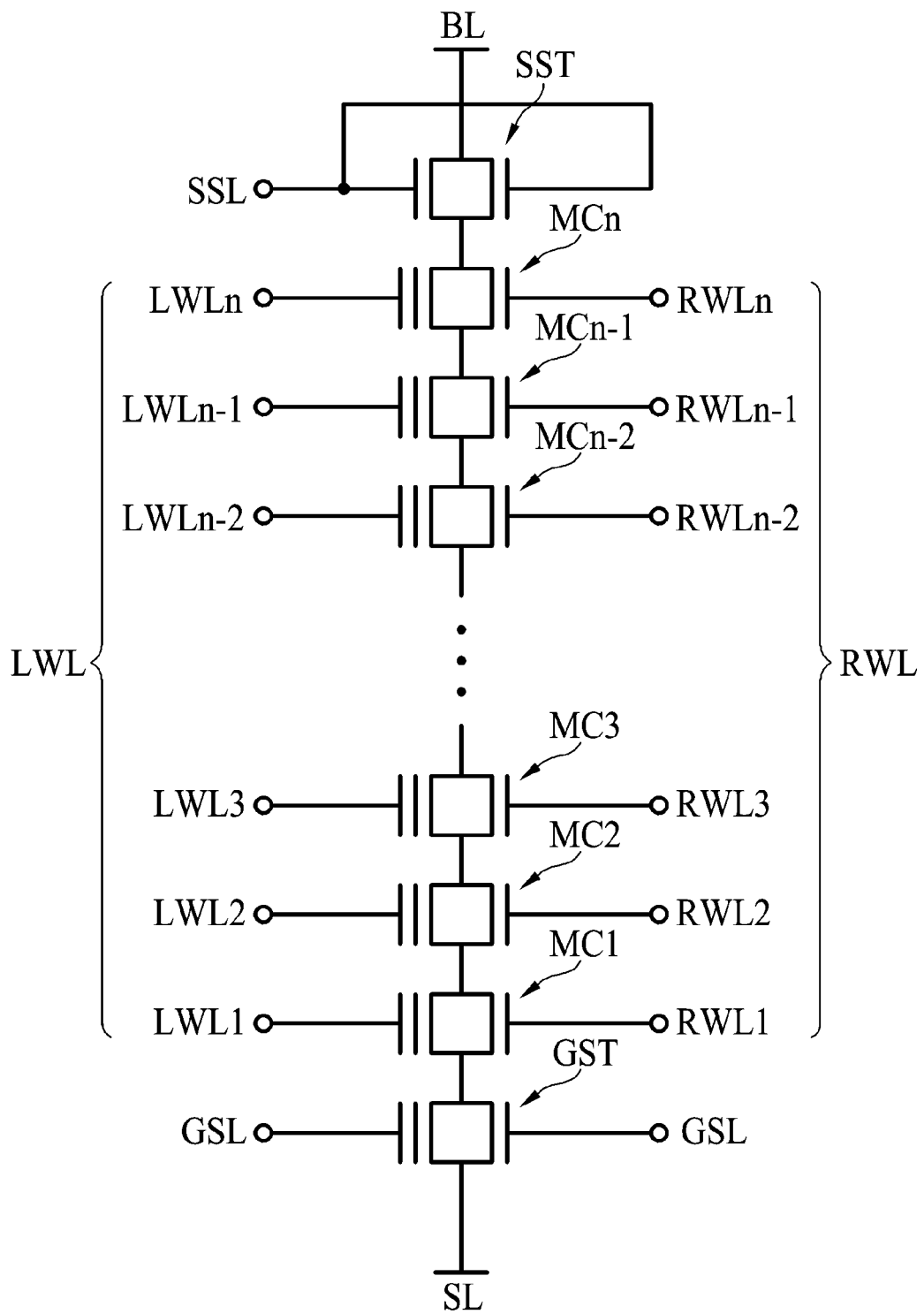
FIGS. 7 and 8 are schematic circuit diagrams illustrating a memory cell string included in a memory device according to example embodiments of the present inventive concept.
Figure 8:
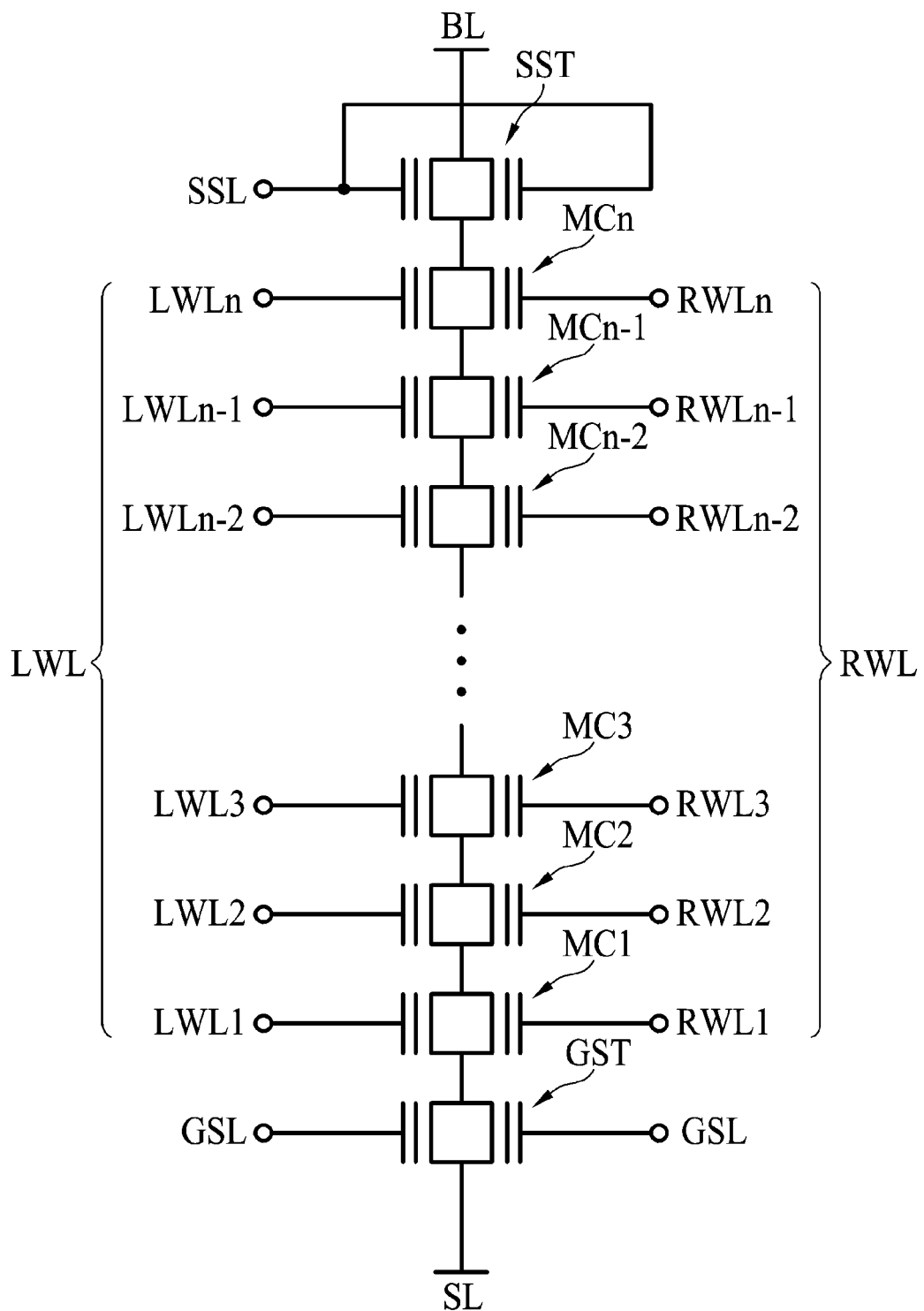

FIGS. 7 and 8 are schematic circuit diagrams illustrating a memory cell string included in a memory device according to example embodiments.

Referring to FIG. 7, a memory cell string 50 may include memory cells MC1 to MCn connected to one another in series and sharing a channel region, a first switching cell GST, a second switching cell SST, and the like. The first switching cell GST may be connected between the memory cells MC1 to MCn and a source line SL, and the second switching cell SST may be connected between the memory cells MC1 to MCn and a bit line BL. In example embodiments, the first switching cell GST may include first and second gates both connected to the ground select line GSL, and the second switching cell SST may include first and second gates both connected to the string select line SSL. In example embodiments, the first switching cell GST may include first and second gates each connected to a different ground select line GSL, and the second switching cell SST may include first and second gates each connected to a different string select line SSL. In some examples, the first gate of the first switching cell GST may be connected to a first ground select line LGSL and the second gate of the first switching cell GST may be connected to a second ground select line RGSL. In some examples, the first gate of the second switching cell SST may be connected to a first string select line LSSL and the second gate of the second switching cell SST may be connected to a second string select line RSSL. Thus, different voltages may be input to the first gate and the second gate of each of the first switching cell GST and the second switching cell SST. Each of the memory cells MC1 to MCn may include a first gate connected to first word lines LWL1 to LWLn (LWL), and a second gate connected to second word lines RWL1 to RWLn (RWL). Therefore, different voltages may be input to the first gate and the second gate of each of the memory cells MC1 to MCn.

Each of the memory cells MC1 to MCn may include a data storage layer of a ferroelectric material. In the example embodiment illustrated in FIG. 7, the data storage layer may only be disposed between first gates of the memory cells MC1 to MCn and the first switching cell GST and the channel region, and a second gate of the first switching cell GST and the second switching cell SST may not include the data storage layer. In example embodiments, the first and second gates of the first switching cell GST do not include the data storage layer. In an example, the data storage layer may be a metal oxide having a perovskite structure. In an example embodiment, the data storage layer may be represented by the formula $ABO_3$ consisting of cations A and B and three oxygen ions. In the above formula, A may be one or more selected from barium (Ba), lead (Pb), strontium (Sr), bismuth (Bi), calcium (Ca), magnesium (Mg), sodium (Na), potassium (K) and rare earth elements, and B may be one or more selected from titanium (Ti), zirconium (Zr), niobium (Nb), tantalum (Ta), tungsten (W), manganese (Mn), iron (Fe), cobalt (Co), nickel (Ni), chromium (Cr), magnesium (Mg) and the like. In an example, the data storage layer may be formed of barium titanate ($BaTiO_3$).

For example, when at least one selected memory cell and the remaining unselected memory cells are determined from the memory cells MC1 to MCn, a read voltage or a programming voltage may be input to a first gate of the at least one selected memory cell, and a second gate of the at least one selected memory cell may be a floating gate. In addition, first gates of the unselected memory cells may be a floating gate, and second gates of the unselected memory cells may receive a pass voltage. Thus, a current path may be formed to pass through the channel region in a selected memory cell string, and a voltage of the channel region may be boosted in unselected memory cell strings, and data of the unselected memory cells may not be changed.

A memory cell string 60 according to an example embodiment illustrated in FIG. 8 may have a structure similar to that of the example embodiment illustrated in FIG. 7. However, the data storage layer formed of a ferroelectric material may also be formed between each second gate of the memory cells MC1 to MCn and the channel region, and the second switching cell SST may also include the data storage layer. In a manner different from the example embodiments illustrated in FIGS. 7 and 8, the data storage layer may not be included in the first switching cell GST, or may only be disposed between the first gate and the channel region in the second switching cell SST.

Figure 9:
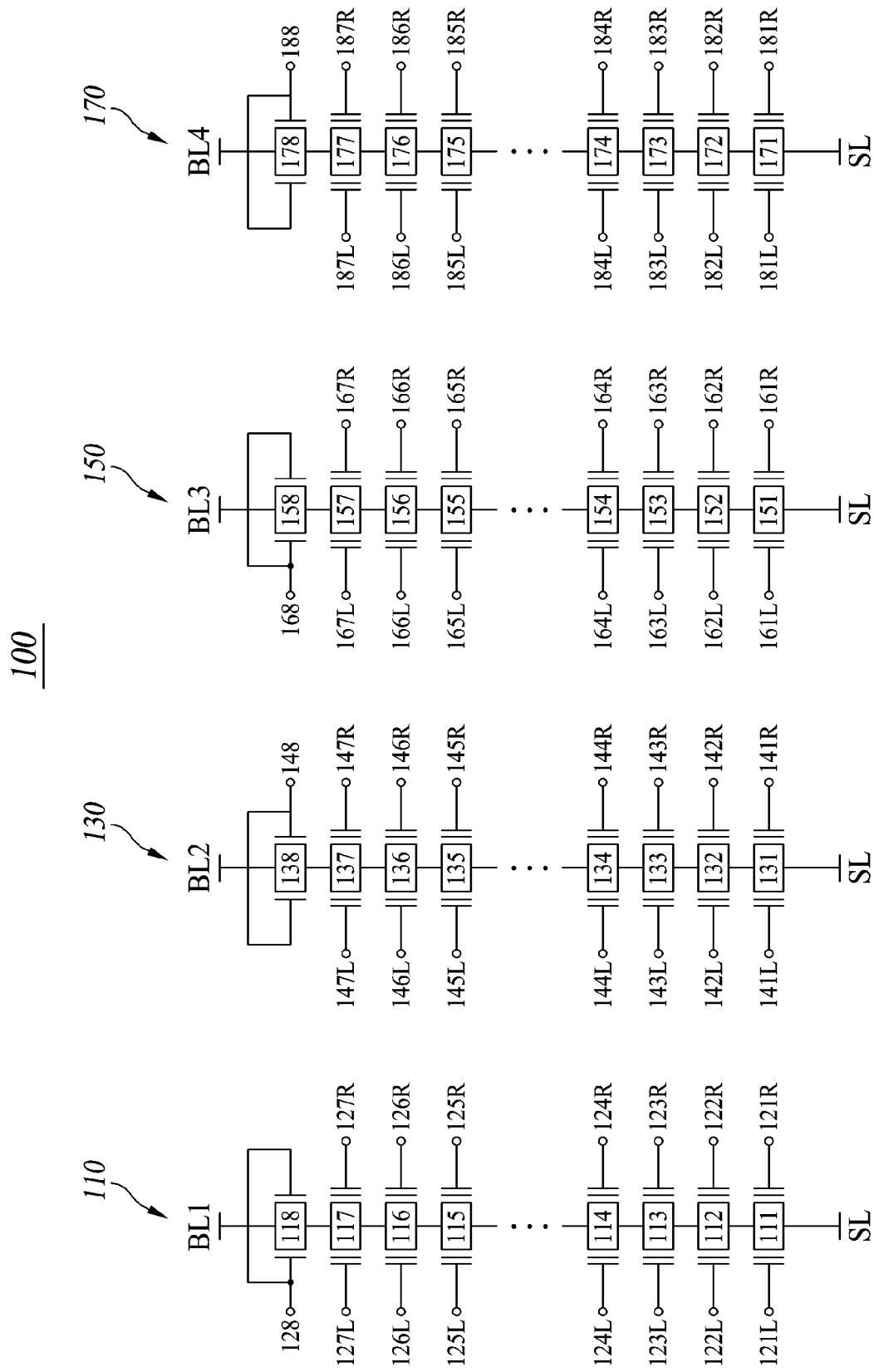
FIGS. 9 to 11 are views illustrating operations of a memory device according to example embodiments of the present inventive concept.
Figure 10:
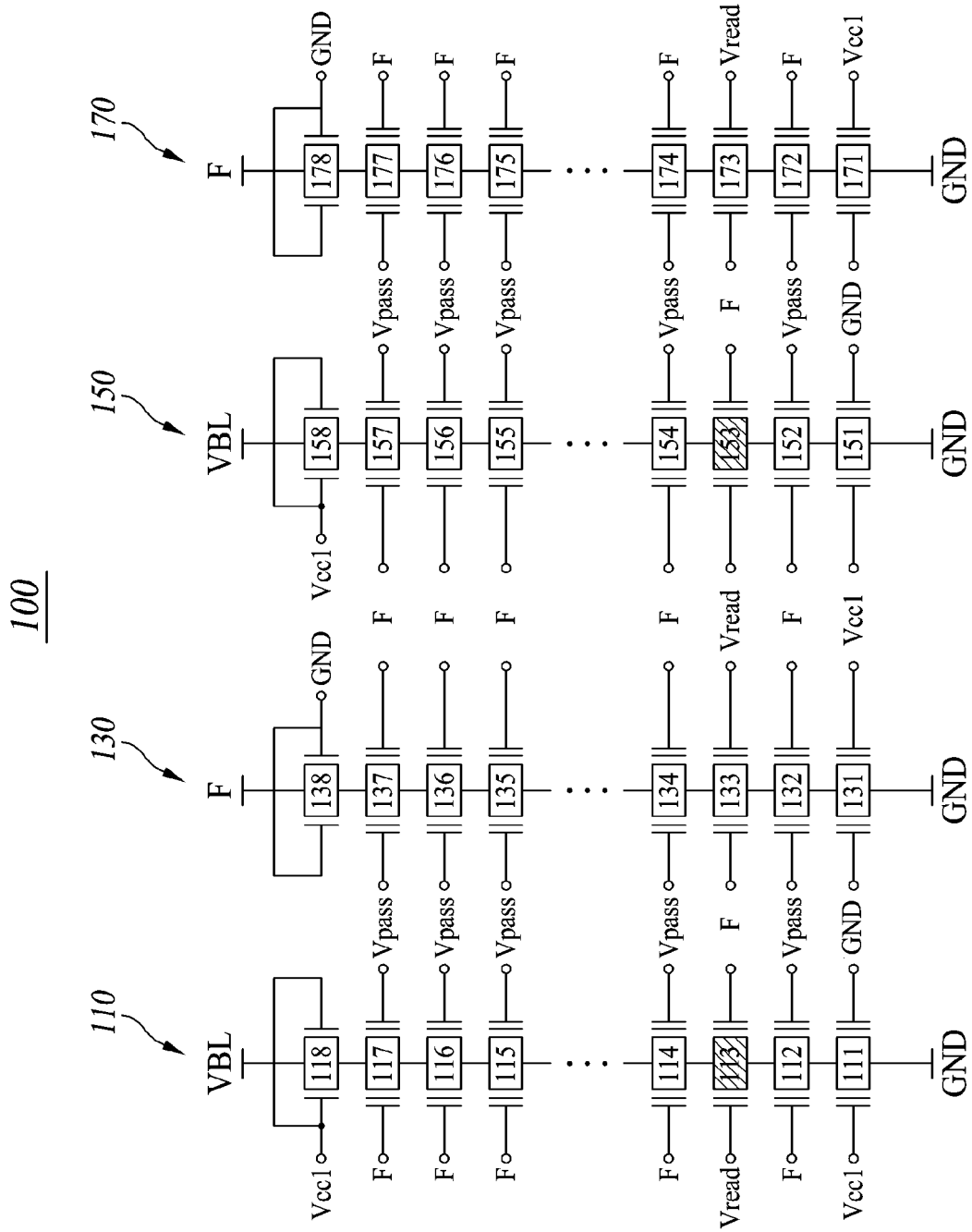
Figure 11:
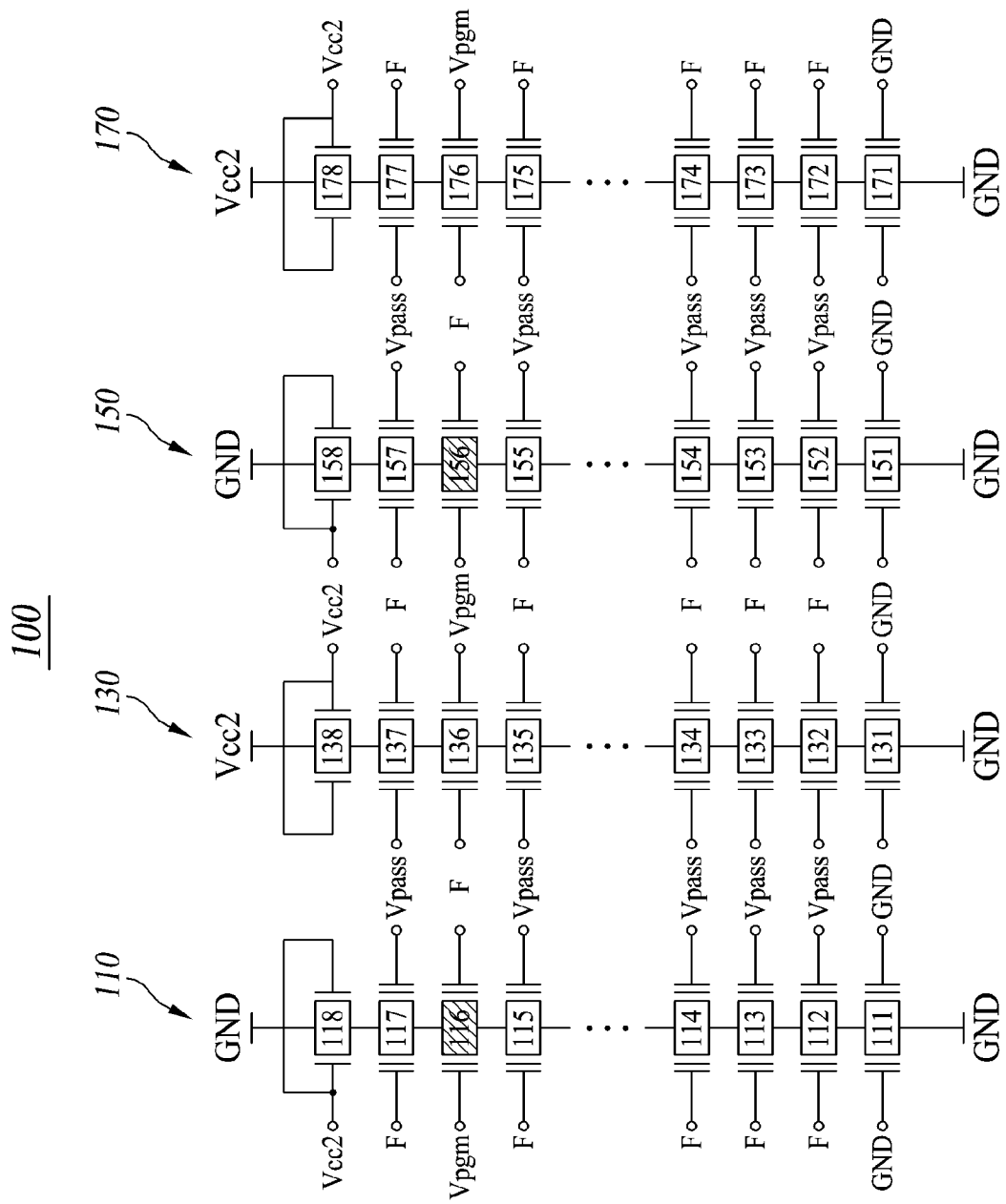

FIGS. 9 to 11 are views illustrating operations of a memory device according to example embodiments.

Referring to FIG. 9, a memory device 100 according to an example embodiment may include first to fourth memory cell strings 110, 130, 150 and 170. For example, each of the first to fourth memory cell strings 110, 130, 150 and 170 may have the same structure. The structure of the memory cell strings 110, 130, 150 and 170 will be described with reference to a description of the structure of the first memory cell string 110.

The first memory cell string 110 may include memory cells 112 to 117 connected to each other in series, a first switching cell 111 connected between the memory cells 112 to 117 and a first source line SL1, a second switching cell 118 connected between the memory cells 112 to 117 and a first bit line BL1, and the like. The memory cells 112 to 117 may share a channel region with each other and may include a data storage layer formed of a ferroelectric material. The data storage layer may be formed in at least one of a gap between a first gate and the channel region and a gap between a second gate and the channel region. Each of the memory cells 112 to 117 may include a first gate and a second gate. First gates may be connected to first word lines 122L to 127L, and second gates may be connected to second word lines 122R to 127R.

The memory cells 112 to 117, the first switching cell 111, and the second switching cell 118 may include a channel region shared by the first gate and the second gate, and gate insulating layers disposed between the channel region and the first and second gates. In an example, a first gate insulating layer may be disposed between the channel region and the first gate, and a second gate insulating layer may be disposed between the channel region and the second gate. Although the example embodiment illustrated in FIGS. 9 to 11 illustrates that the first and second gate insulating layers have the same structure, the first and second gate insulating layers may also have different structures.

In each of the memory cells 112 to 117, the first gate and the second gate may be electrically isolated from each other. Thus, different voltages may be input to the first gate and the second gate. The first gate and the second gate of the first switching cell 111 may be connected to different ground select lines 121L and 121R, or may be electrically connected to each other to be connected to one ground select line. The first gate and the second gate of the second switching cell 118 may be electrically connected to each other and may be connected to a single string select line 128.

In an example embodiment, the second word lines 122R to 127R connected to the second gates of the memory cells 112 to 117 in the first memory cell string 110 may be connected to first word lines 142L to 147L of another memory cell string, for example, of the second memory cell string 130 adjacent to the first memory cell string 110, respectively. For example, the second gates of the memory cells 112 to 117 of the first memory cell string 110 and first gates of memory cells 132 to 137 of the second memory cell string 130 may share the word lines, and the degree of integration of the memory device may be increased.

Alternatively, in an example embodiment, the second gates of the memory cells 112 to 117 of the first memory cell string 110 and the first gates of the memory cells 132 to 137 of the second memory cell string 130 may be connected to different word lines to be electrically isolated from each other. In this case, the degree of integration of the memory device may be relatively low, but the first memory cell string 110 and the second memory cell string 130 may operate independently of each other.

The second to fourth memory cell strings 130, 150 and 170 may respectively have a structure similar to that of the first memory cell string 110. Hereinafter, operations of the memory device will be described with reference to FIGS. 10 and 11. In an example embodiment illustrated in FIGS. 10 and 11, memory cells may share word lines in the memory cell strings 110, 130, 150 and 170 adjacent to each other. In an example, second word lines 162R to 167R connected to second gates of the third memory cell string 150 may be connected to first word lines 182L to 187L connected to first gates of the fourth memory cell string 170, respectively.

The first to fourth memory cell strings 110, 130, 150 and 170 may be connected to the first, a second, a third and a fourth source lines SL1, SL2, SL3 and SL4, respectively. In some examples, the first, second, third and fourth source lines SL1, SL2, SL3 and SL4 may be connected to a common source line CSL.

An example embodiment illustrated in FIG. 10 may correspond to a reading operation of the memory device 100. Referring to FIGS. 9 and 10, a control circuit of the memory device 100 may determine selected memory cells 113 and 153 among the first memory cell string 110 and the third memory cell string 150, respectively. Referring to the first memory cell string 110, a bit line voltage VBL may be input to the first bit line BL1, and a first power supply voltage Vcc1 may be input to the string select line 128, to turn on the second switching cell 118. In addition, the first switching cell 111 may be turned on by inputting the first power supply voltage Vcc1 to the ground select line 121L and a ground voltage GND to the first source line SL1. For example, the bit line of each of the second and fourth memory cell strings 130 and 170 in which the selected memory cell is not present may be a floating line.

In the first memory cell string 110, a read voltage Vread may be input to a first gate of the selected memory cell 113, and a second gate thereof may be a floating gate, and first gates of unselected memory cells 112 and 114 to 117 may be floating gates, and a pass voltage Vpass may be input to second gates thereof. Therefore, the unselected memory cells 112 and 114 to 117 may be turned on by the pass voltage Vpass input to the second gates of the unselected memory cells, and a current path may be formed through the channel region shared by the memory cells 112 to 117. A page buffer connected to the first bit line BL1 may determine data written to the selected memory cell 113 by reading a threshold voltage of the selected memory cell 113 by the read voltage Vread varying in a predetermined range.

An operation of reading data from the selected memory cell 153 of the third memory cell string 150 may be similar to that described above. In the example embodiment illustrated in FIG. 10, each of the second gates of the memory cells 112 to 117 included in the first memory cell string 110 and each of the first gates of the memory cells 132 to 137 included in the second memory cell string 130 may be connected to the same word line. Therefore, in the example embodiment illustrated in FIG. 10, data may not be simultaneously read from odd-numbered memory cell strings 110 and 150 and even-numbered memory cell strings 130 and 170. By designing the memory cell strings 110, 130, 150 and 170 not to share the word line, data in the odd-numbered memory cell strings 110 and 150 and the even-numbered memory cell strings 130 and 170 may be read simultaneously.

In some examples, when the memory cell 113 of the first memory cell string 110 is selected in a reading operation a first switching cell 131 of the second memory cell string 130 may turn off by inputting a ground voltage to first and second gates of the first switching cell 131. In some examples, when the memory cell 153 of the third memory cell string 150 is selected in a reading operation a first switching cell 171 of the fourth memory cell string 170 may turn off by inputting a ground voltage to first and second gates of the first switching cell 171.

In a reading operation, a dipole polarity of the data storage layer formed between the first gates and the channel region of unselected memory cells may not be changed by floating the first gates of the unselected memory cells and thus a threshold voltage of the unselected memory cells may not be changed.

An example embodiment illustrated in FIG. 11 may correspond to a programming operation of the memory device 100. Referring to FIGS. 9 and 11, the control circuit of the memory device 100 may determine selected memory cells 116 and 156 in the first memory cell string 110 and the third memory cell string 150, respectively. Referring to the first memory cell string 110, a ground voltage GND may be input to the first bit line BL1, and a second power supply voltage Vcc2 may be input to the string select line 128 to turn on the second switching cell 118. In addition, the first switching cell 111 may be turned off by inputting the ground voltage GND to the ground select lines and the source lines SL1 to SL4. The second power supply voltage Vcc2 may be greater than the first power supply voltage Vcc1 used in the reading operation.

In the first memory cell string 110, a programming voltage Vpgm may be input to a first gate of the selected memory cell 116, and a second gate thereof may be a floating gate. In addition, first gates of unselected memory cells 112 to 115 and 117 may be floating gates, and a pass voltage Vpass may be input to second gates thereof. The pass voltage Vpass of the programming operation may be greater than the pass voltage Vpass of the reading operation. A dipole polarity change of the data storage layer occurs due to the programming voltage Vpgm input to the first gate of the selected memory cell 116, and a threshold voltage of the selected memory cell 116 may be changed.

In a programming operation, a dipole polarity of the data storage layer formed between the first gates and the channel region of unselected memory cells may not be changed by floating the first gates of the unselected memory cells and thus a threshold voltage of the unselected memory cells may not be changed.

In the second and fourth memory cell strings 130 and 170 without the selected memory cells 116 and 156, a second power supply voltage Vcc2 may be input to the second and fourth bit lines BL2 and BL4, such that second switching cells 138 and 178 may be turned off. In the second and fourth memory cell strings 130 and 170, a voltage of a channel region may be boosted by the pass voltage Vpass. Therefore, the unselected memory cells receiving the programming voltage Vpgm through the second gates in the second and fourth memory cell strings 130 and 170 may not be programmed.

As described with reference to FIGS. 10 and 11, in the example embodiment, the first gate may be used as a control gate for a reading operation and a programming operation, and the second gate may be used for simply turning on memory cells and the like. Thus, a data storage layer having a ferroelectric material may not be formed between the second gate and the channel region in the respective memory cells. In some examples, a data storage layer having a ferroelectric material may be formed only between the first gate and the channel region in the respective memory cells.

In some examples, at least two adjacent memory cell strings of the memory cell strings 110, 130, 150 and 170 may not share word lines. As the at least two adjacent memory cell strings of the memory cell strings 110, 130, 150 and 170 do not share word lines, the memory cell strings 110, 130, 150 and 170 may operate respectively and independently.

FIGS. 12 to 16 are schematic views of a memory device according to example embodiments.

Figure 12:
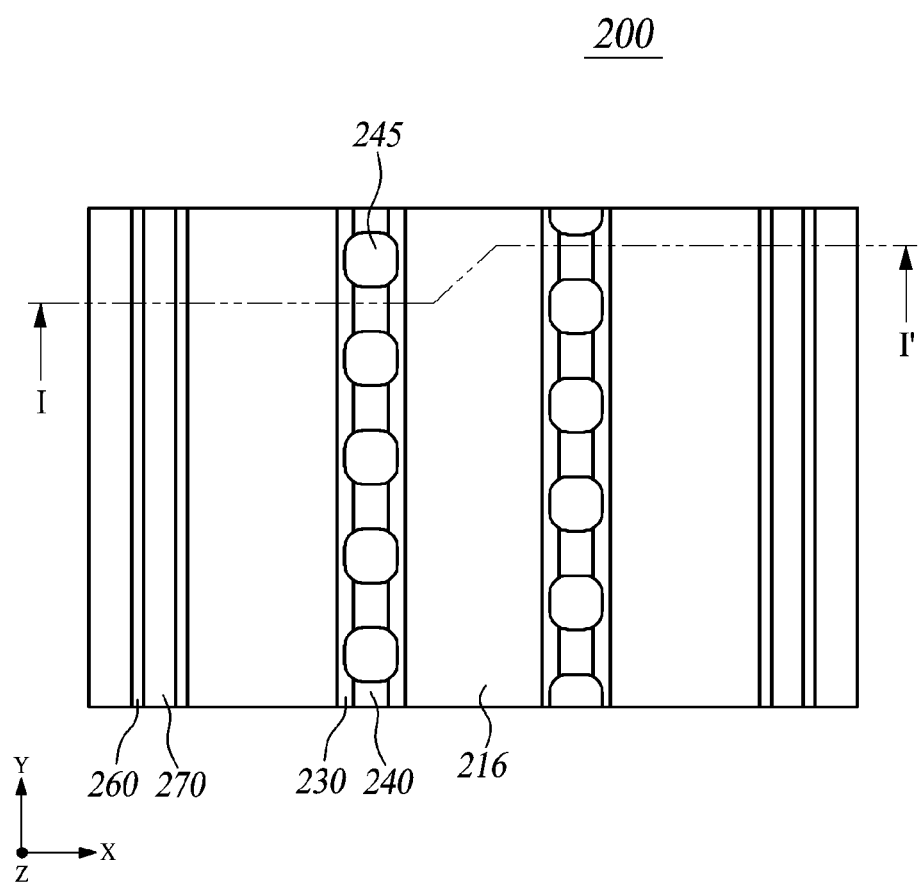
FIGS. 12 to 14 are schematic views of a memory device according to an example embodiment of the present inventive concept.
Figure 13:
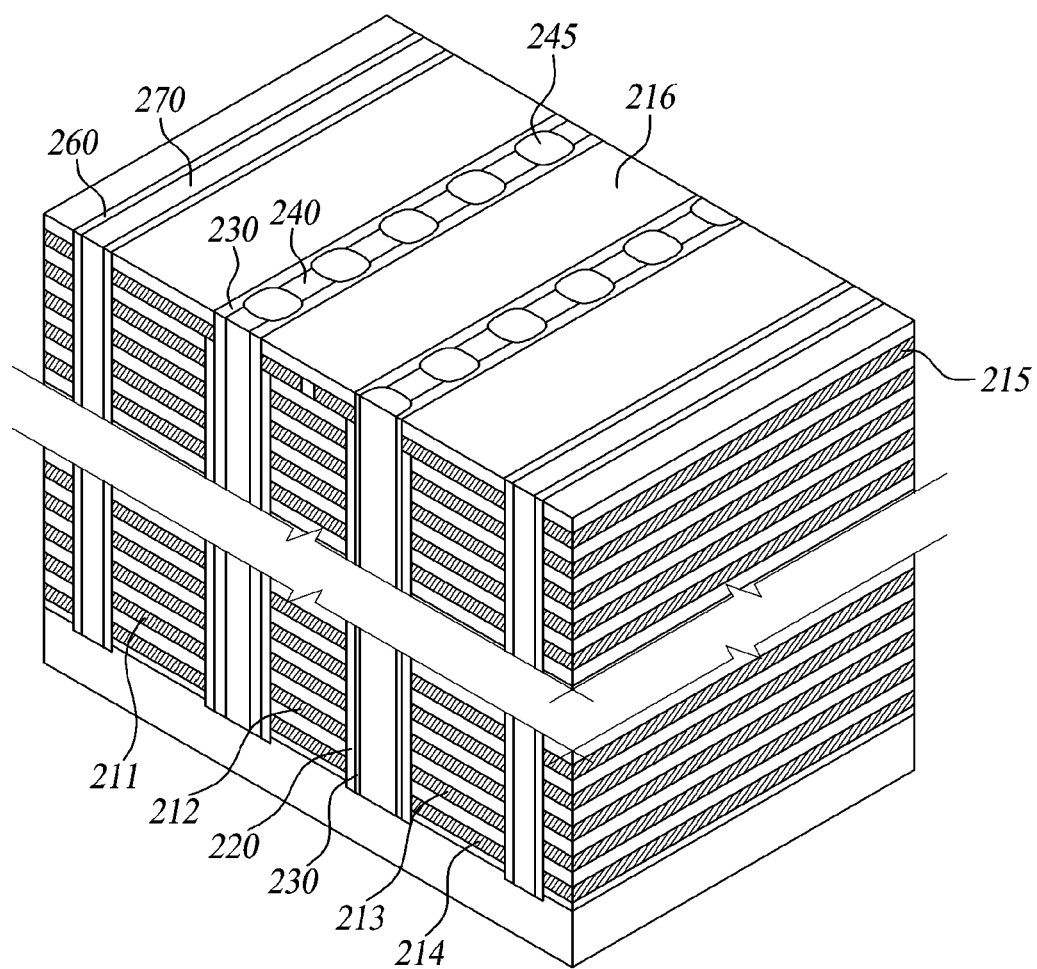
Figure 14:
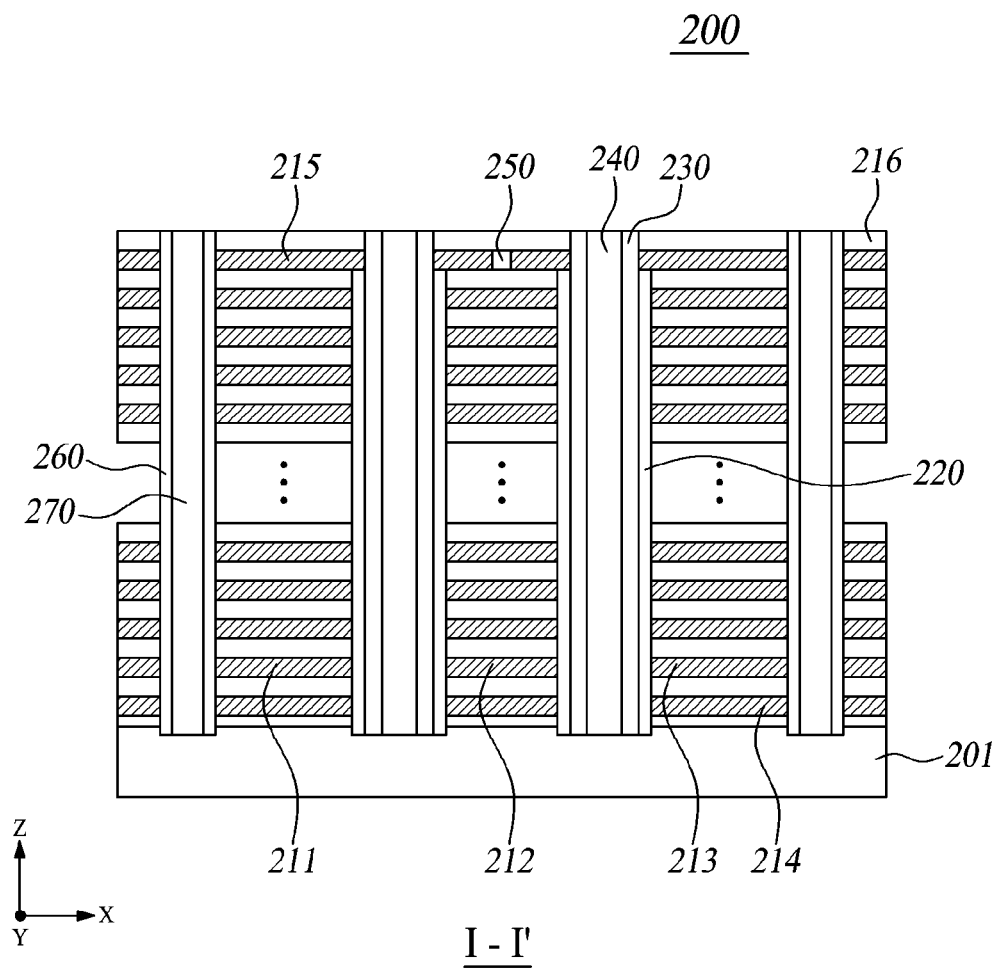
Figure 15:
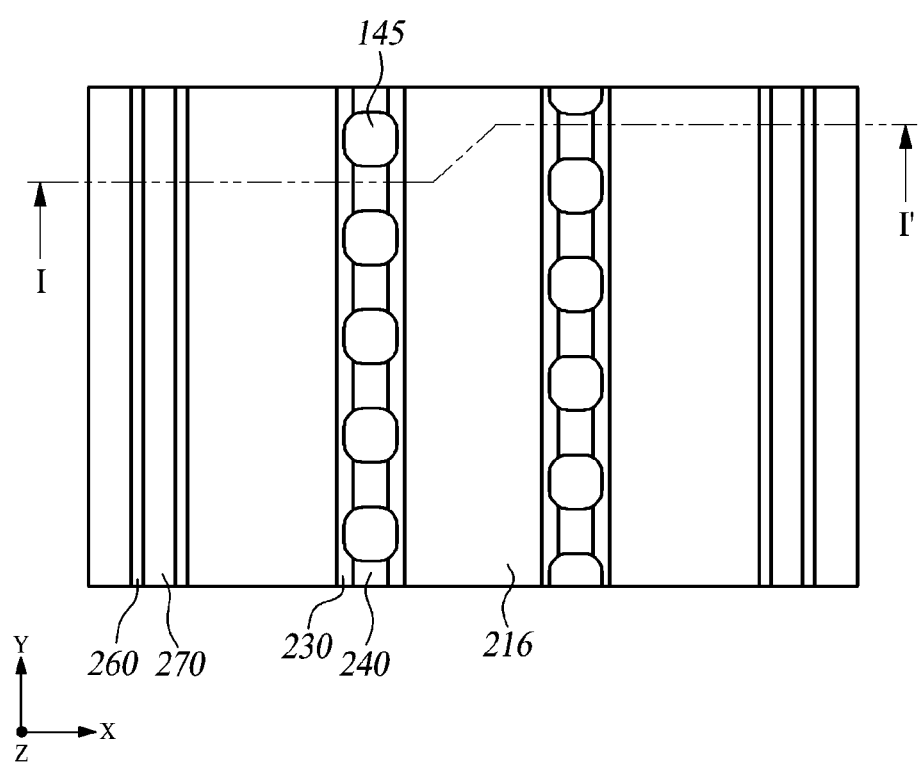
FIGS. 15 to 18 are schematic views of a memory device according to example embodiments of the present inventive concept.
Figure 16:
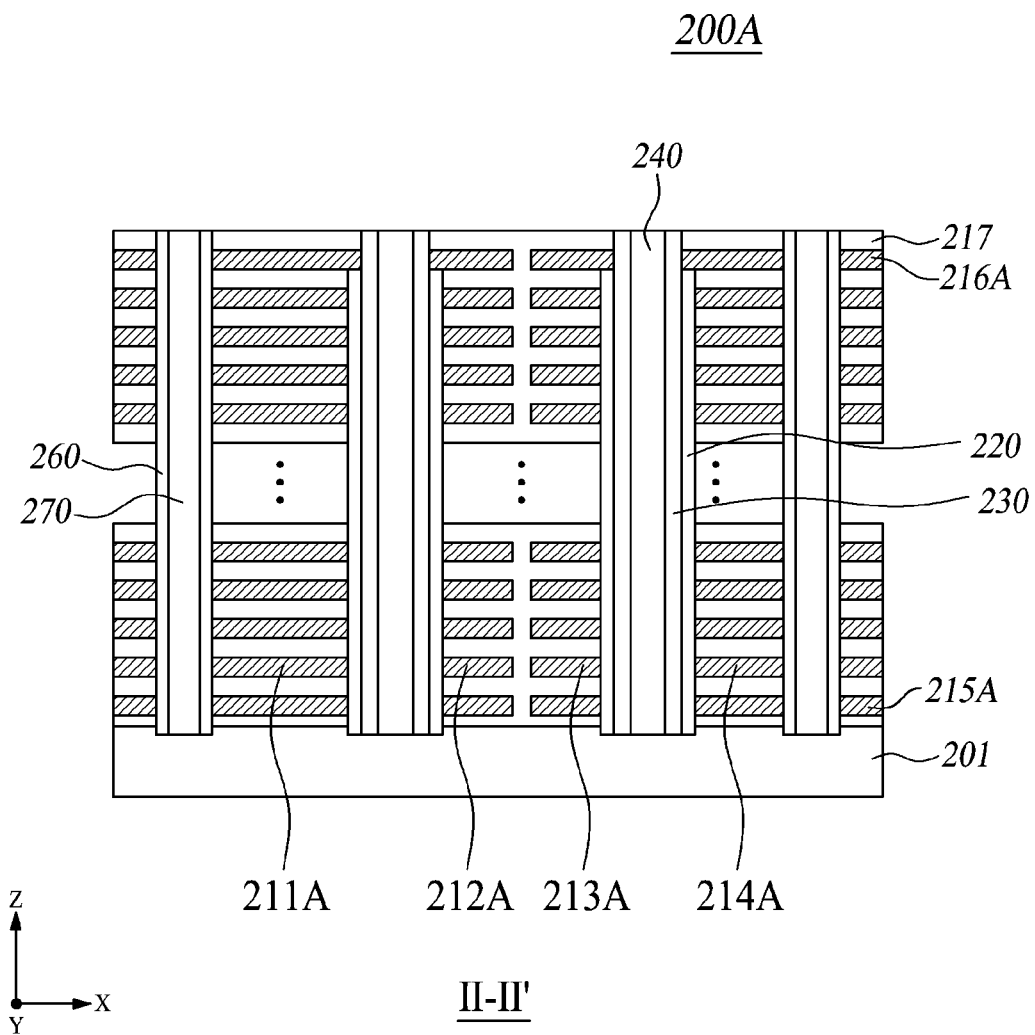

FIG. 12 is a plan view illustrating a cell region of a memory device 200, FIG. 13 is a perspective view illustrating a cell region, and FIG. 14 is a cross-sectional view taken along line I-I' of FIG. 12, according to an example embodiment. FIG. 15 is a plan view illustrating a cell region of a memory device 200A, and FIG. 16 is a cross-sectional view illustrating a cross section taken along line I-I' of FIG. 15, according to an example embodiment.

Referring to FIGS. 12 to 14, the memory device 200 may include a substrate 201, a plurality of gate electrode layers 211 to 215 and a plurality of insulating layers 216, alternately stacked on each other, a data storage layer 220 including a ferroelectric material, a dielectric layer 230, a plurality of channel regions 240, a vertical insulating layer 260, a common source line 270, and the like. Hereinafter, the common source line may correspond to the source line SL of FIGS. 4, 7, and 8. The plurality of gate electrode layers 211 to 215 may provide word lines 211 to 213, a first select line 214, and a second select line 215. The data storage layer 220 and the dielectric layer 230 may be disposed between the plurality of word lines 211 to 213 and the channel regions 240, and may extend in a direction perpendicular to an upper surface of the substrate 201, for example, a Z-axis direction and in a first direction parallel to the upper surface of the substrate 201, for example, a Y-axis direction.

The plurality of word lines 211 to 213 may be formed of a conductive material such as polysilicon, a metal or a metal compound, and may extend in the first direction. In an example, at least portions of the word lines 211 to 213, having different heights, may extend to have different lengths in the first direction, to provide pad regions connected to contacts. The plurality of insulating layers 216 may be formed of a silicon oxide or the like.

The plurality of channel regions 240 may be separated from each other by a plurality of channel separation layers 245 in the first direction, and may be adjacent to the word lines 211 to 213 in a second direction, for example, an X-axis direction. For example, a width of each of the plurality of channel separation layers 245 may be greater than a width of each of the plurality of channel regions 240, in the second direction. Therefore, the plurality of channel regions 240 may be separated completely from each other by the plurality of channel separation layers 245 in the first direction. In an example, the word lines 211 and 212 adjacent to one sides of the channel regions 240 in the second direction (see left sides thereof in FIGS. 12 to 14) may be defined as first word lines 211 and 212, and the word lines 212 and 213 adjacent to the other sides of the channel regions 240 (see the right sides thereof in FIG. 12 to FIG. 14) may be defined as second word lines 212 and 213. The word lines 212 disposed between the channel regions 240 in the second direction may be the second word lines 212 for portions of the channel regions 240, and may also be the first word lines 212 for portions of the channel regions 240.

The data storage layer 220 and the dielectric layer 230 between the channel regions 240 and the right side of each of the first word lines 211 and 212 may be defined as a first gate insulating layer, and the data storage layer 220 and the dielectric layer 230 between the channel regions 240 and the left side of each of the second word lines 212 and 213 may be defined as a second gate insulating layer. For example, in the example embodiment illustrated in FIGS. 12 to 14, the first gate insulating layer may be formed between the left side of each of the channel regions 240 and the first word lines 211 and 212, and the second gate insulating layer may be formed between the right side of each of the first channel regions 240 and the second word lines 212 and 213. The first gate insulating layer and the second gate insulating layer may have the same structure as illustrated in FIG. 14, or may also have different structures.

In an example, the data storage layer 220 may only be formed on one side of the channel regions 240 in the second direction. For example, in the example embodiment illustrated in FIGS. 12 to 14, the data storage layer 220 may only be formed on the first gate insulating layer formed on the left side of the channel regions 240, and the data storage layer 220 may not be formed on the second gate insulating layer formed on the right side of the channel regions 240. Since the second word lines 212 and 213 adjacent to the right side of the channel region 240 receive a voltage for simply turning on the memory cells or forming a current path through the channel region, the data storage layer 220 may not be formed on the second gate insulating layer.

In the example embodiment of the present inventive concept, the memory device 200 may include a plurality of memory cell strings. One memory cell string includes one channel region 240 extending in a third direction, for example, a Z-axis direction perpendicular to the upper surface of the substrate, and word lines 211 to 213 adjacent to the channel region 240 in the second direction, a data storage layer 220 and a dielectric layer 230 formed therebetween, and the like. Thus, each of the memory cells included in the memory cell string includes a first gate and a second gate provided by word lines 211 to 213 adjacent to both sides of the channel regions 240 in the second direction, and the first gate and the second gate may be electrically isolated to receive different voltages.

The second select line 215 may be divided into a plurality of regions by a horizontal separation layer 250 in the second direction, to individually control memory cell strings adjacent to each other in the second direction. The horizontal separation layer 250 may be formed between the channel regions 240 adjacent to each other in the second direction to divide the second select line 215 into a plurality of regions.

In an example embodiment, a height of the data storage layer 220 may be different from a height of the dielectric layer 230 in the third direction. Referring to FIGS. 13 and 14, the height of the data storage layer 220 may be lower than that of the dielectric layer 230. In an example, the data storage layer 220 may extend to uppermost word lines 211 to 213 and may not extend to the second select line 215. For example, the data storage layer 220 may not be formed between the second select line 215 and the dielectric layer 230.

Referring to FIGS. 15 and 16, in a manner similar to the memory device 200 described above, a memory device 200A may include a substrate 201, a plurality of gate electrode layers 211A to 216A and a plurality of insulating layers 217, alternately stacked with each other, a data storage layer 220 having a ferroelectric material, a dielectric layer 230, a plurality of channel regions 240, a vertical insulating layer 260, a common source line 270, and the like. At least portions of the plurality of gate electrode layers 211A to 216A may extend to have different lengths in a first direction, for example, a Y-axis direction, to provide a plurality of pad regions.

In the case of the memory device 200A in the example embodiment illustrated in FIGS. 15 and 16, word lines 212A and 213A may be separated from each other, between the channel regions 240 in the second direction, for example, an X-axis direction, in a manner different from that of the memory device 200 described above with reference to FIGS. 12 to 14. For example, the word lines 211A to 214A included in the memory device 200A may not be adjacent to two or more different channel regions 240 in the first direction.

In the example embodiment illustrated in FIGS. 15 and 16, a memory cell may be provided by one channel region 240, word lines 211A to 214A adjacent to both sides of the channel region 240 in the second direction, the data storage layer 220 and the dielectric layer 230 formed therebetween, and the like. Each of the memory cells included in the memory cell string includes a first gate and a second gate provided by word lines 211A to 214A adjacent to both sides of the channel region 240 in the second direction. The first gate and the second gate may be electrically isolated to receive different voltages. Since a plurality of word lines 212A and 213A are disposed to be separated from each other in the second direction, between the channel regions 240, the memory cell strings adjacent to each other in the second direction may operate independently without interfering with each other.

Figure 17:
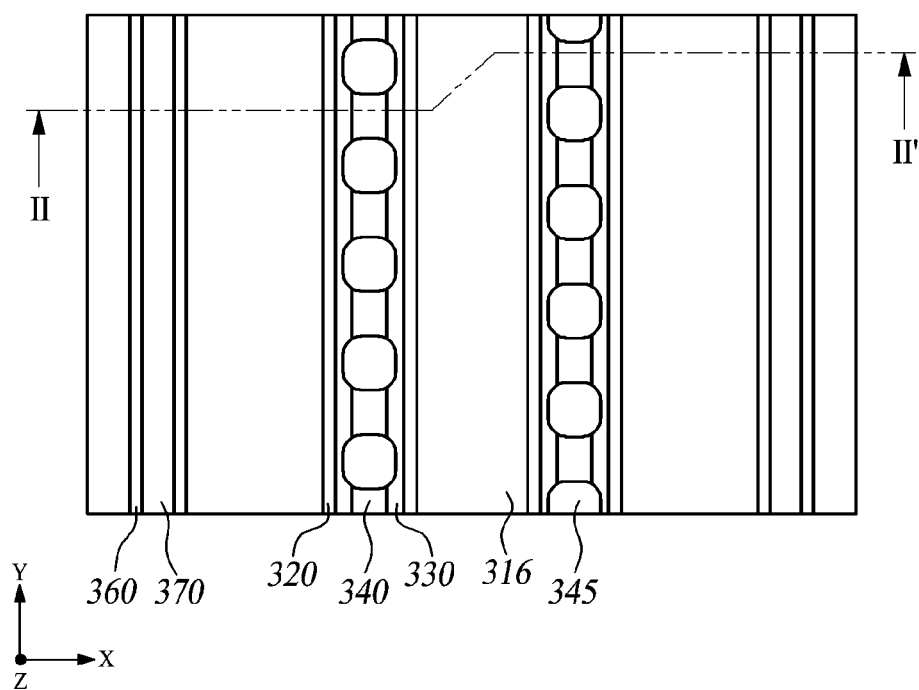
Figure 18:
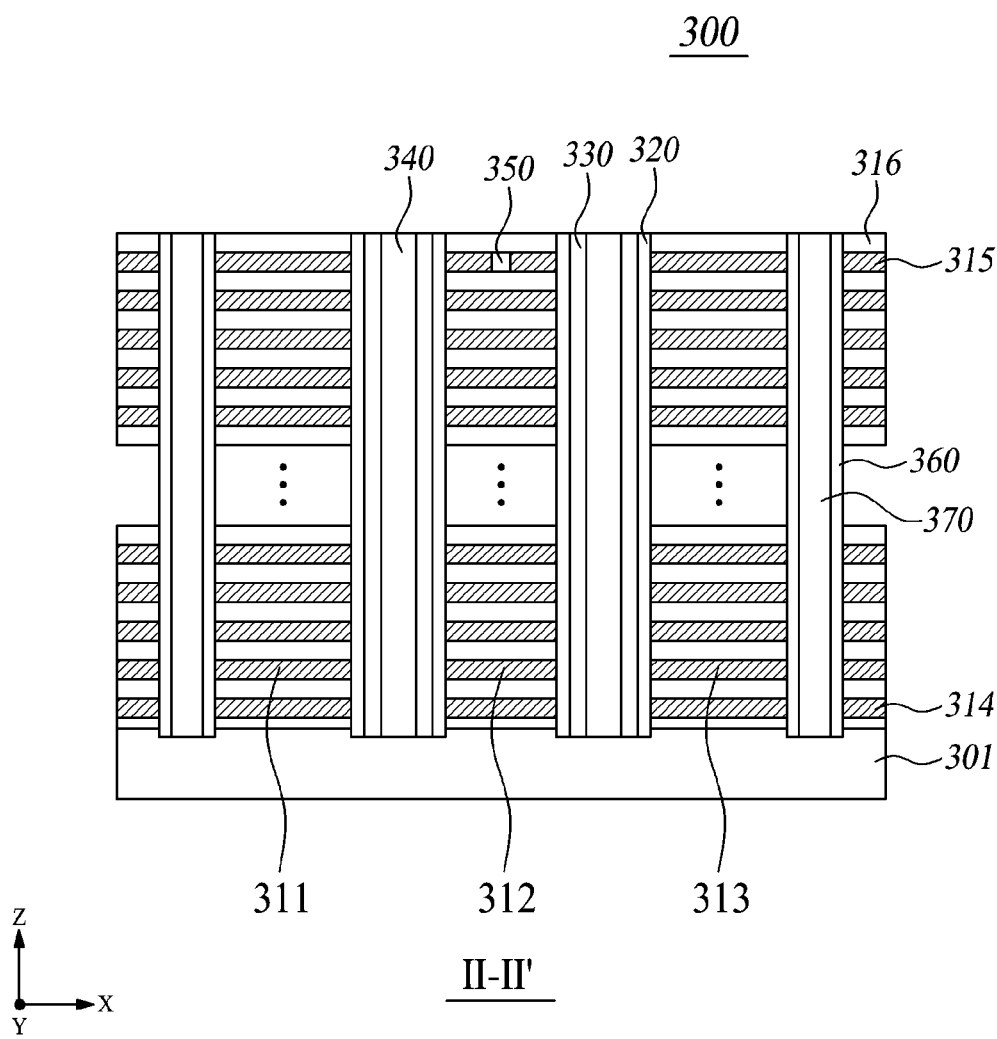

FIGS. 17 and 18 are schematic views of a memory device according to an example embodiment.

FIG. 17 is a plan view illustrating a cell region of a memory device 300, and FIG. 18 is a cross-sectional view illustrating a cross section taken along line II-II' of FIG. 17. The memory device 300 may include a substrate 301, a plurality of gate electrode layers 311 to 315 and a plurality of insulating layers 316 alternately stacked with each other, a data storage layer 320 having a ferroelectric material, a dielectric layer 330, a plurality of channel regions 340, a vertical insulating layer 360, a common source line 370, and the like. The plurality of gate electrode layers 311 to 315 may provide word lines 311 to 313, a first select line 314, and a second select line 315. The data storage layer 320 and the dielectric layer 330 may be disposed between the plurality of word lines 311 to 313 and the channel regions 340, and may extend in a direction perpendicular to an upper surface of the substrate 301, a Z-axis direction and in a first direction, for example, a Y-axis direction, parallel to the upper surface of the substrate 301.

In the memory device 300 according to the example embodiment illustrated in FIGS. 17 and 18, the data storage layer 320 may have substantially the same height as that of the dielectric layer 330. The data storage layer 320 may extend to the second select line 315 located above the word lines 311 to 313, similarly to the case of the dielectric layer 330. For example, the memory cells provided by the word lines 311 to 313 and the second switching cell provided by the second select line 315 may have the same structure.

In the example embodiment of FIGS. 17 and 18, the data storage layer 320 may only be formed on one side of each of the channel regions 340 in the second direction (the X-axis direction). Referring to FIG. 18, since the word lines 312 and 313 adjacent to the right side of the channel regions 340 receive a voltage for simply turning on the memory cells or forming a current path through the channel region, the data storage layer 320 may not be formed on the left side of the second word lines 312 and 313.

FIGS. 19 to 22 are diagrams illustrating the operation of the memory device according to example embodiments.

Figure 19:
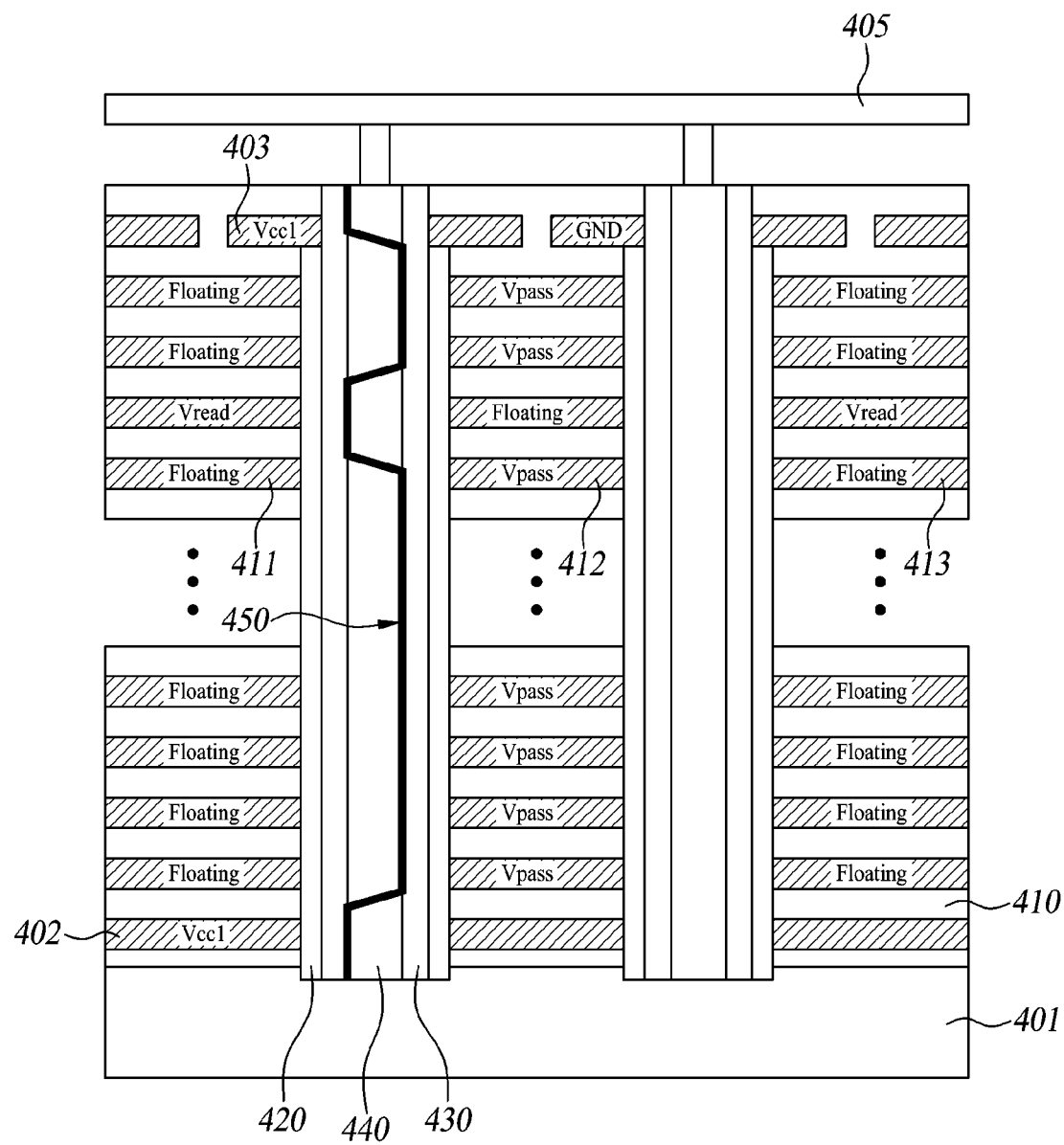
FIGS. 19 to 22 are views illustrating operations of a memory device according to example embodiments of the present inventive concept.
Figure 20:
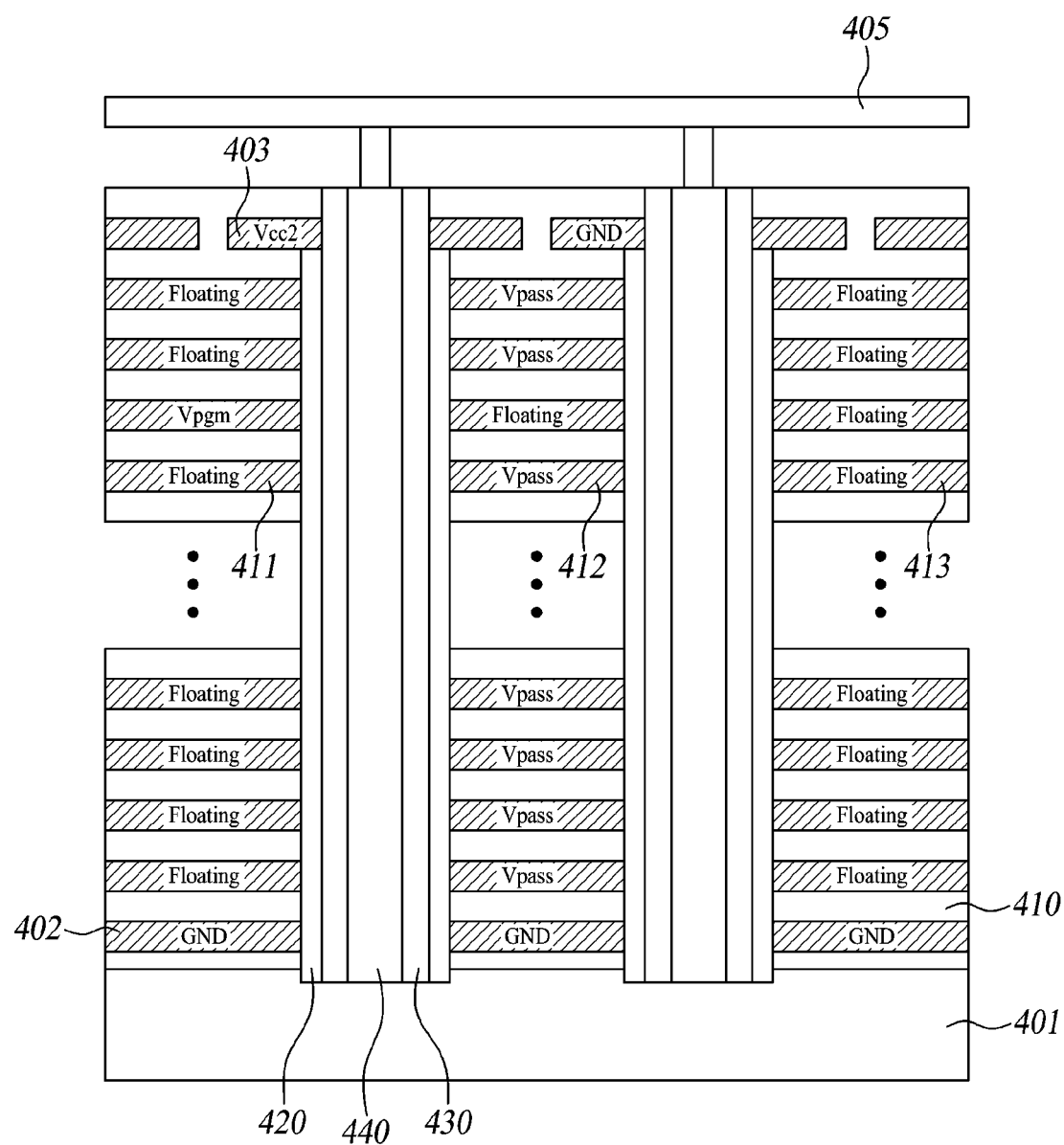

First, a reading operation and a programming operation of a memory device 400 according to an example embodiment will be described with reference to FIGS. 19 and 20. Referring to FIGS. 19 and 20, the memory device 400 may include first select lines 402, word lines 411 to 413, and second select lines 403, and the like, stacked on a substrate 401. Insulating layers 410 may be disposed between the first select lines 402, the word lines 411 to 413, and the second select lines 403.

Memory cells may include channel regions 440, word lines 411 to 413 adjacent to both sides of the channel regions 440, a data storage layer 420, a dielectric layer 430, and the like. Each of the memory cells includes a first gate and a second gate provided by the word lines 411 to 413 adjacent to both sides of the channel region 440, and the first gate and the second gate may be electrically isolated to receive different voltages. In the example embodiment illustrated in FIGS. 19 and 20, the channel regions 440 may be connected to a single bit line 405.

Referring to FIG. 19, a control circuit of the memory device 400 may input a read voltage Vread to a word line providing a first gate of a selected memory cell from which data is to be read. The control circuit may float a word line providing a second gate of the selected memory cell and word lines providing first gates of unselected memory cells that share the channel region 440 together with the selected memory cell.

The control circuit may input a pass voltage Vpass to word lines providing second gates of the unselected memory cells, and may apply a first power supply voltage Vcc1 to the first select line 402 and the second select line 403 of a selected memory cell string to turn on a first switching cell and a second switching cell of the selected memory cell string. At this time, the second select lines 403 of memory cell strings having no selected memory cell may receive a ground voltage GND, and the first select lines 402 of memory cell strings having no selected memory cell may receive the ground voltage GND.

The unselected memory cells may be turned on by the pass voltage Vpass, and a current path 450 through the channel region 440 as illustrated in FIG. 19 may be formed. The control circuit may sense a current flowing through the current path 450 while changing a magnitude of the read voltage Vread, to measure a threshold voltage of the selected memory cell and determine data stored in the selected memory cell.

In the reading operation, a dipole polarity of the data storage layer formed between the first gates and the channel region of unselected memory cells may not be changed by floating the first gates of the unselected memory cells and thus a threshold voltage of the unselected memory cells may not be changed.

Referring to FIG. 20, the control circuit of the memory device 400 may input a programming voltage Vpgm to a word line that provides a first gate of a selected memory cell to which data is to be written. The control circuit may float a word line providing a second gate of the selected memory cell and word lines providing first gates of unselected memory cells that share the channel region 440 together with the selected memory cell.

The control circuit may input a pass voltage Vpass to word lines providing second gates of the unselected memory cells, a ground voltage to the bit line 405 and the first select lines 402, and a second power supply voltage Vcc2 to the second select line 403 of the selected memory cell string. Thus, in the memory cell string having the selected memory cell, the second switching cell may be turned on. The second select lines 403 of the memory cell string without the selected memory cell may receive the ground voltage GND. Thus, in the memory cell string without a selected memory cell, the second switching cells of the unselected memory cell stings may be turned off. In an example, the second power supply voltage Vcc2 may be greater than the first power supply voltage Vcc1 and the pass voltage Vpass in the programming operation may be greater than the pass voltage Vpass in the reading operation.

A voltage of the channel region 440 may be boosted by the pass voltage Vpass input to the second gates of the unselected memory cells. A dipole polarity of the data storage layer 420 formed between the first gate and the channel region 440 of the selected memory cell may be changed by the programming voltage Vpgm, and a threshold voltage of the selected memory cell may be changed. The control circuit may write required data to a selected memory cell, by adjusting a magnitude of the programming voltage Vpgm and/or an input time of the programming voltage Vpgm to determine a threshold voltage of the selected memory cell.

In the programming operation, a dipole polarity of the data storage layer 420 formed between the first gates and the channel region 440 of unselected memory cells may not be changed by floating the first gates of the unselected memory cells and thus a threshold voltage of the unselected memory cells may not be changed.

Figure 21:
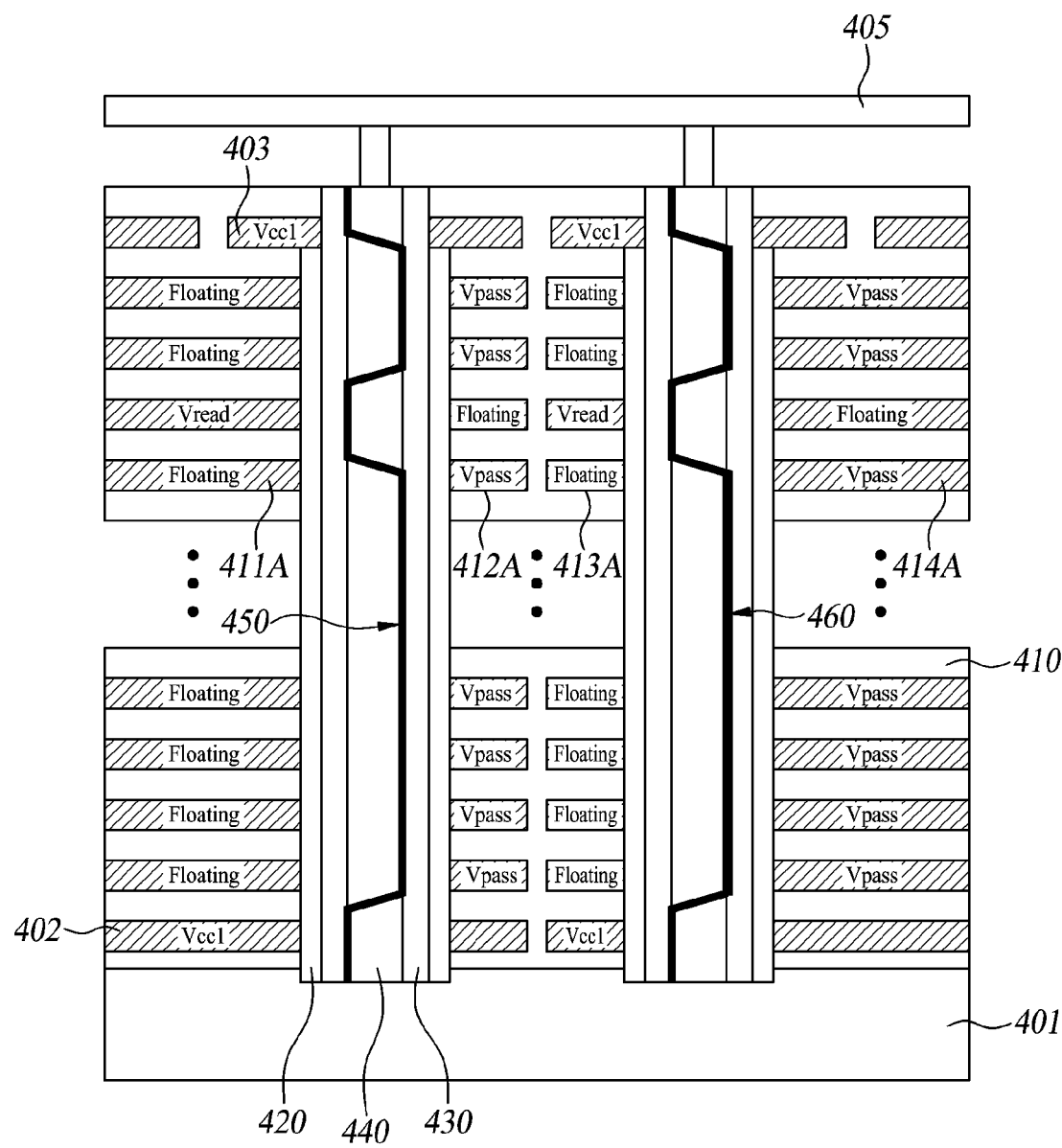
Figure 22:
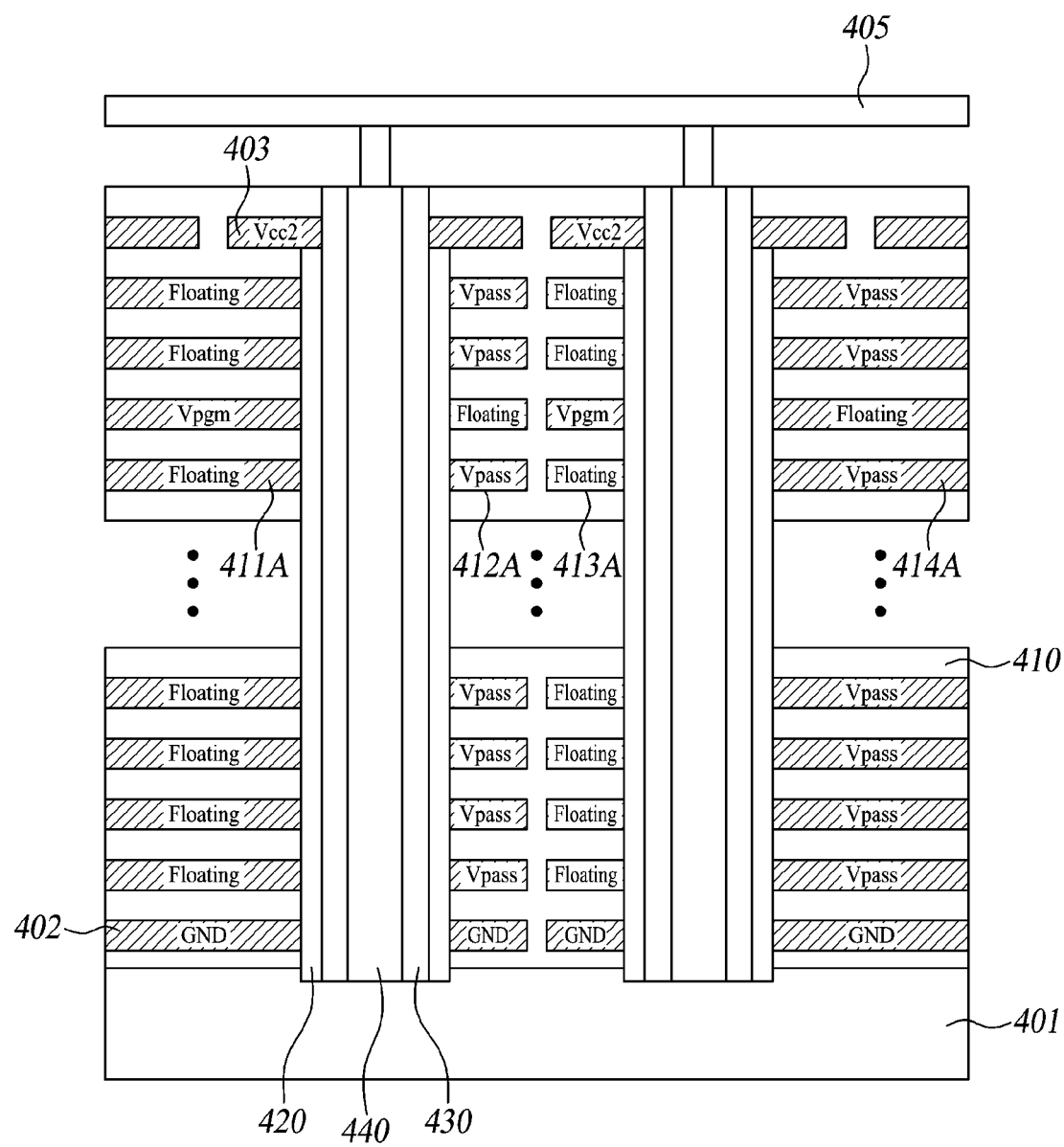

Next, a reading operation and a programming operation of a memory device 400A according to an example embodiment will be described with reference to FIGS. 21 and 22. Referring to FIGS. 21 and 22, the memory device 400A may include first select lines 402, word lines 411A to 414A, and second select lines 403 stacked on a substrate 401. Insulating layers 410 may be disposed between the first select lines 402, the word lines 411A to 414A, and the second select lines 403.

In the example embodiment illustrated in FIGS. 21 and 22, word lines 412A and 413A disposed between the channel regions 440 may be separated from each other. Two and more channel regions 440 may not share at least a portion of the word lines 411A to 414A. Thus, memory cell strings, connected to one bit line 405 and adjacent to each other, may be controlled independently of each other.

Referring to FIG. 21, in a reading operation, a control circuit of memory device 400A may input a read voltage Vread to a word line providing a first gate of a selected memory cell from which data is to be read. The selected memory cell may be respectively selected from the memory cell strings provided by adjacent channel regions 440. The control circuit may float a word line providing a second gate of the selected memory cell and word lines providing first gates of unselected memory cells that share the channel region 440 together with the selected memory cell.

The control circuit may input a pass voltage Vpass to word lines providing second gates of the unselected memory cells, and may apply a first power supply voltage Vcc1 to the first select line 402 and second select line 403 of a selected memory cell string, to turn on a first switching cell and a second switching cell of the selected memory cell string. The unselected memory cells may be turned on by the pass voltage Vpass, and a current path 450 may be formed in each of the channel regions 440 as illustrated in FIG. 21. The control circuit may sense a current flowing through the current path 450 while changing a magnitude of the read voltage Vread, to measure a threshold voltage of the selected memory cell and determine data stored in the selected memory cell. The control circuit may sense a current flowing through a current path 460 after sensed the current flowing through the current path 450.

In example embodiments, the control circuit of memory device 400A may simultaneously read data from two selected memory cells of different memory cell strings when the memory cell strings connected to a different bit line from each other.

Referring to FIG. 22, in a programming operation, the control circuit of the memory device 400A may input a programming voltage Vpgm to a word line providing a first gate of a selected memory cell to which data is to be written. The control circuit may float a word lines providing a second gate of the selected memory cell and word lines providing first gates of unselected memory cells that share a channel region 440 together with the selected memory cell.

The control circuit may input a pass voltage Vpass to word lines providing second gates of the unselected memory cells, the ground voltage to a bit line 405, and the second power supply voltage Vcc2 to the first select lines 402 and the second select line 403 of a selected memory cell string. Thus, the second switching cell of the selected memory cell string may be turned on.

A dipole polarity of the data storage layer 420 formed between the channel region 440 and the first gate of the selected memory cell may be changed by the programming voltage Vpgm input by the control circuit, and a threshold voltage of the selected memory cell may be changed. The control circuit may write required data to the selected memory cell, by adjusting a magnitude of the programming voltage Vpgm and/or an input time of the programming voltage Vpgm to determine the threshold voltage of the selected memory cell.

In example embodiments, the control circuit of memory device 400A may simultaneously write data in two selected memory cells of different memory cell strings when the memory cell strings connected to a different bit line from each other.

FIGS. 23 to 41 are views illustrating a method of manufacturing a memory device according to example embodiments.

Figure 23:
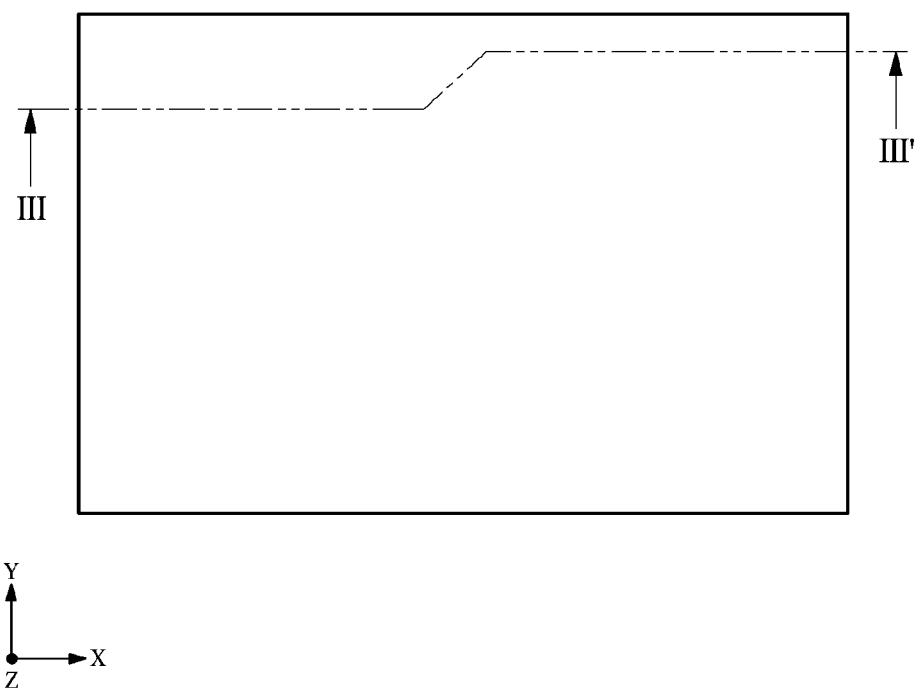
FIGS. 23 to 41 are views illustrating a method of manufacturing a memory device according to example embodiments of the present inventive concept.
Figure 24:
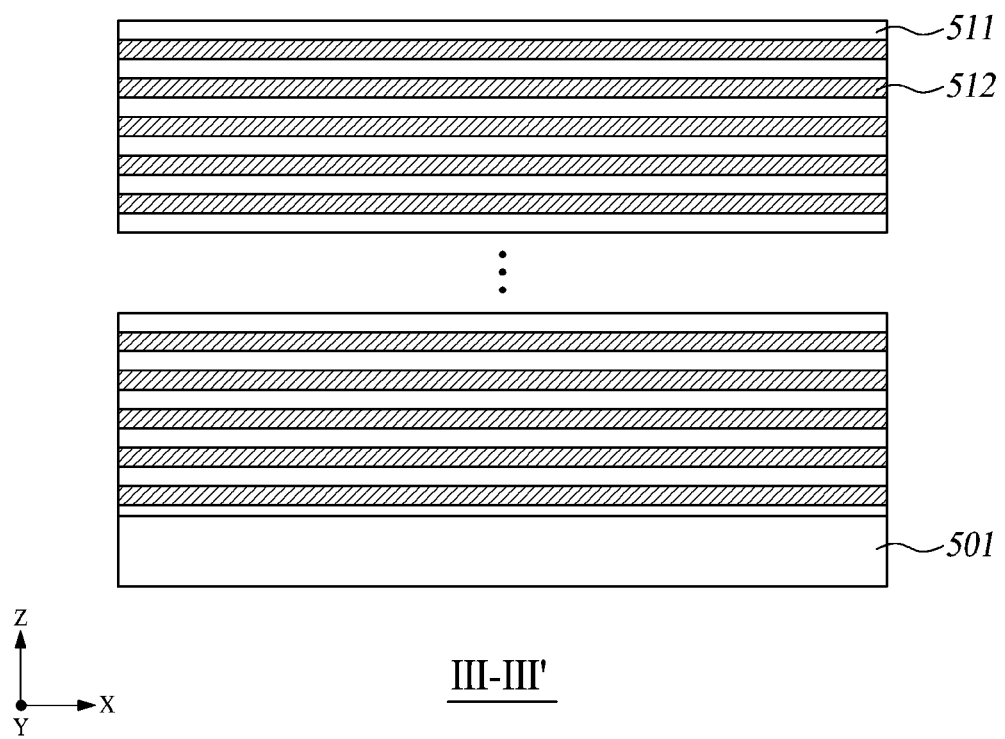

Referring to FIGS. 23 and 24, a plurality of insulating layers 511 and a plurality of gate electrode layers 512 may be alternately stacked on a substrate 501. FIG. 23 is a plan view illustrating a cell region of a memory device. FIG. 24 is a cross-sectional view illustrating a cross section taken along line III-III' of FIG. 23. In an example, the insulating layers 511 may be formed of a silicon oxide or the like, and the gate electrode layers 512 may be formed of polysilicon. The number of the insulating layers 511 and the gate electrode layers 512 may be determined depending on the number of memory cells, switching cells, and dummy cells included in a memory cell string.

Figure 25:
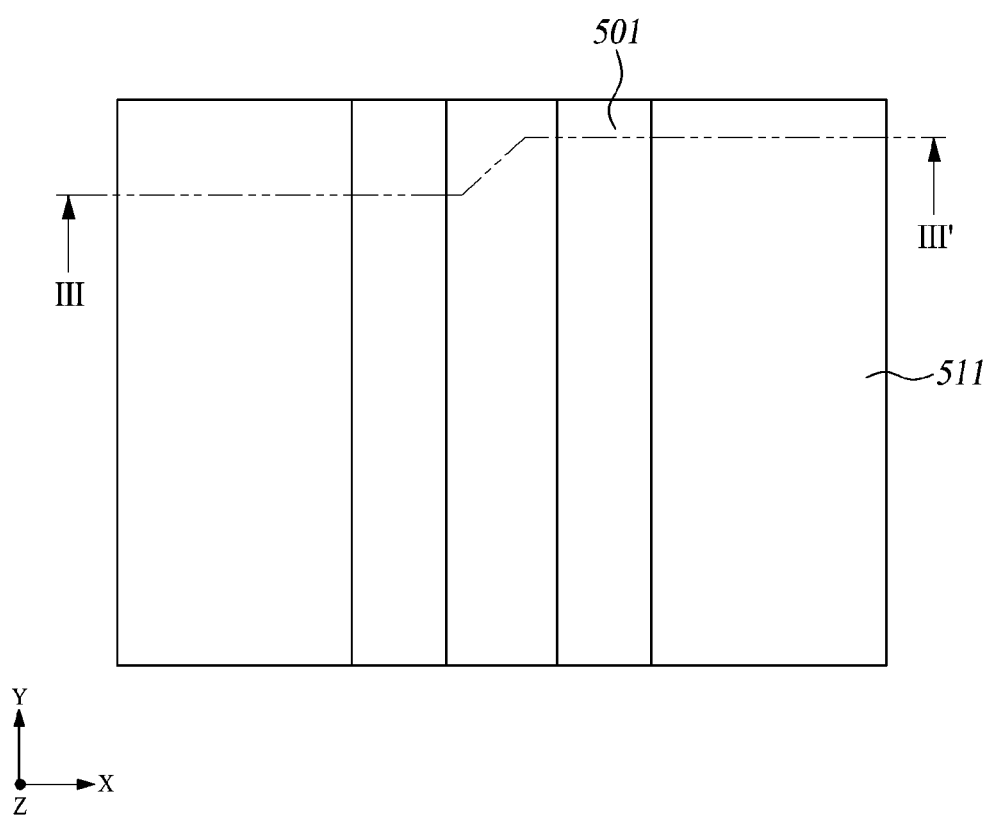
Figure 26:
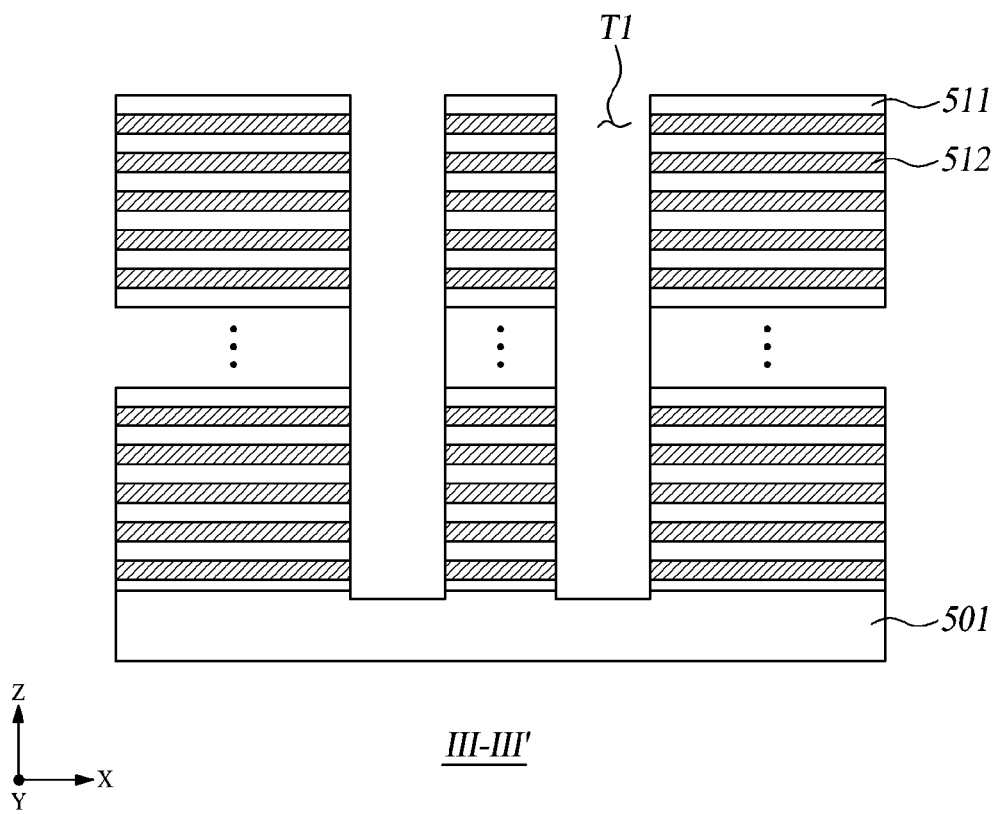

Referring to FIGS. 25 and 26, a first trench T1 may be formed to expose a portion of an upper surface of the substrate 501 by removing portions of the insulating layers 511 and the gate electrode layers 512. The first trench T1 may extend in a first direction, for example, a Y-axis direction.

Figure 27:
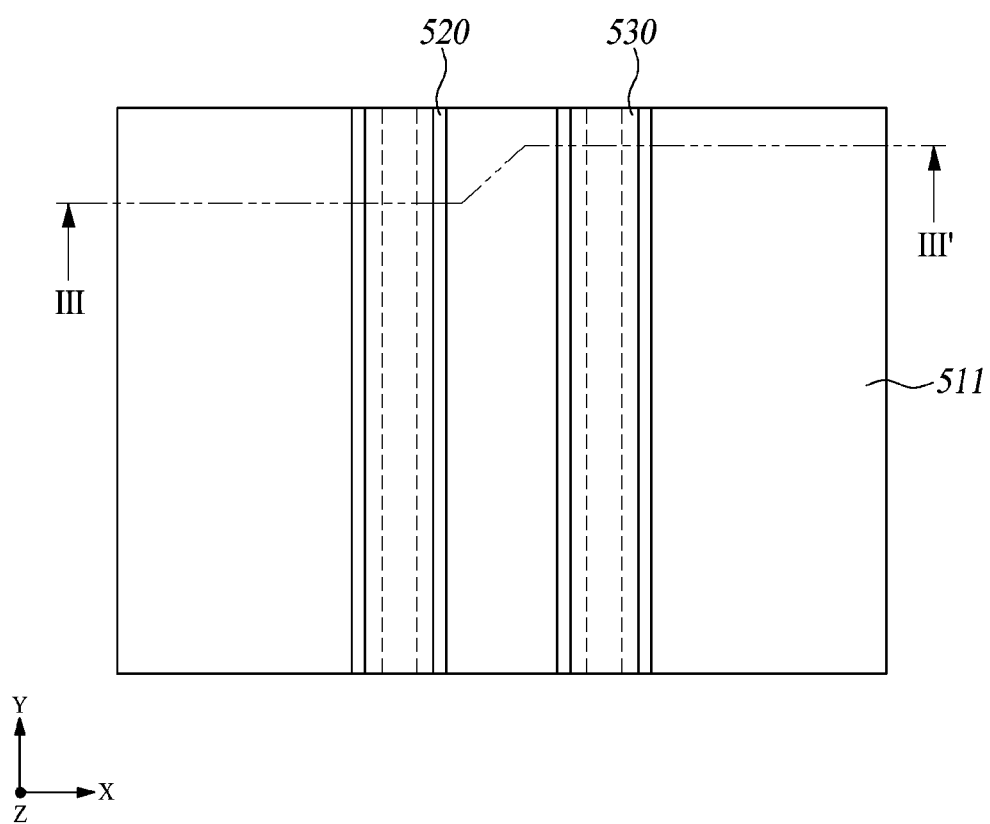
Figure 28:
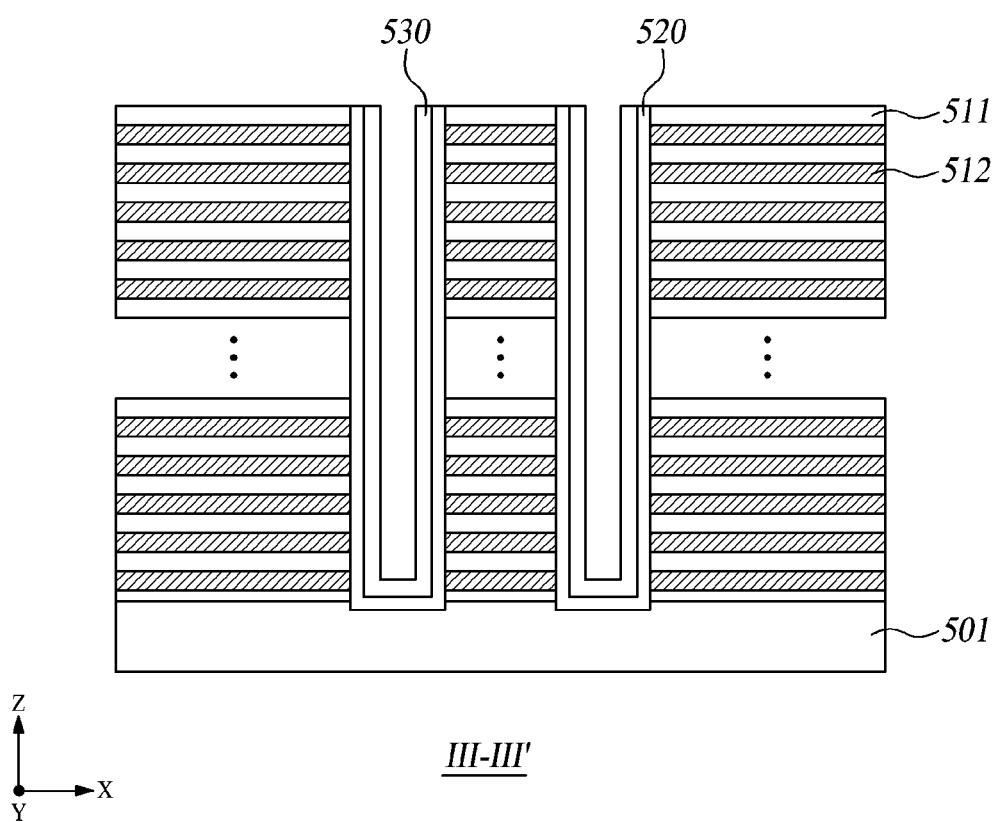
Figure 29:
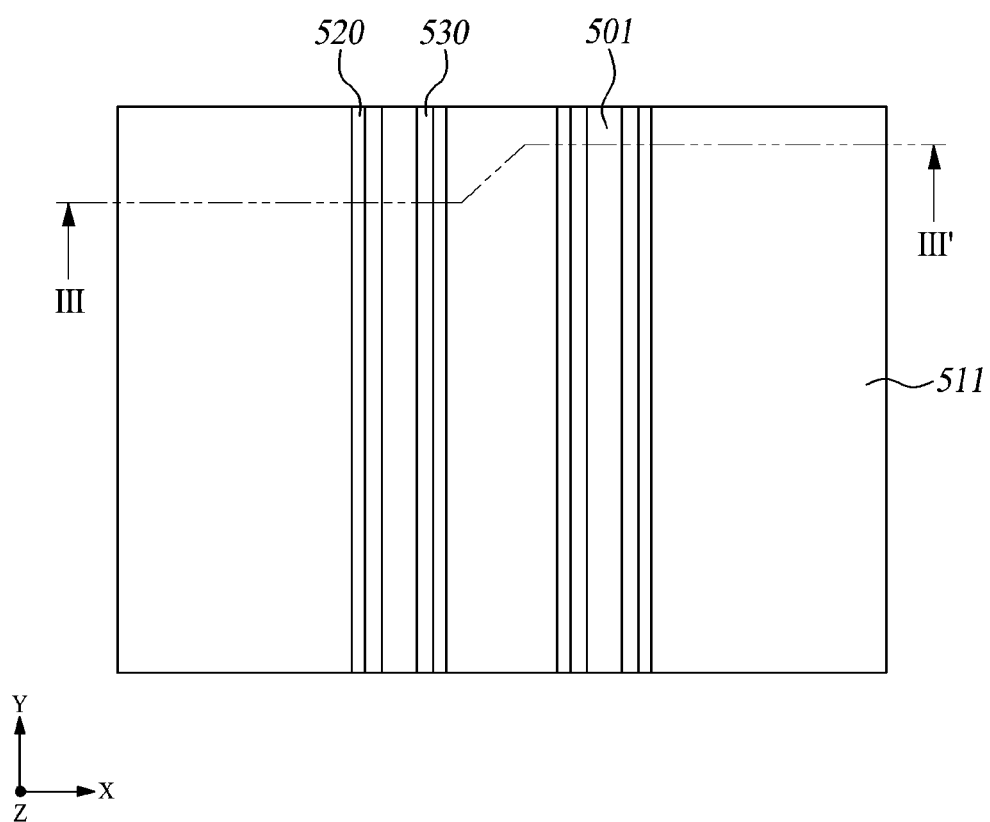
Figure 30:
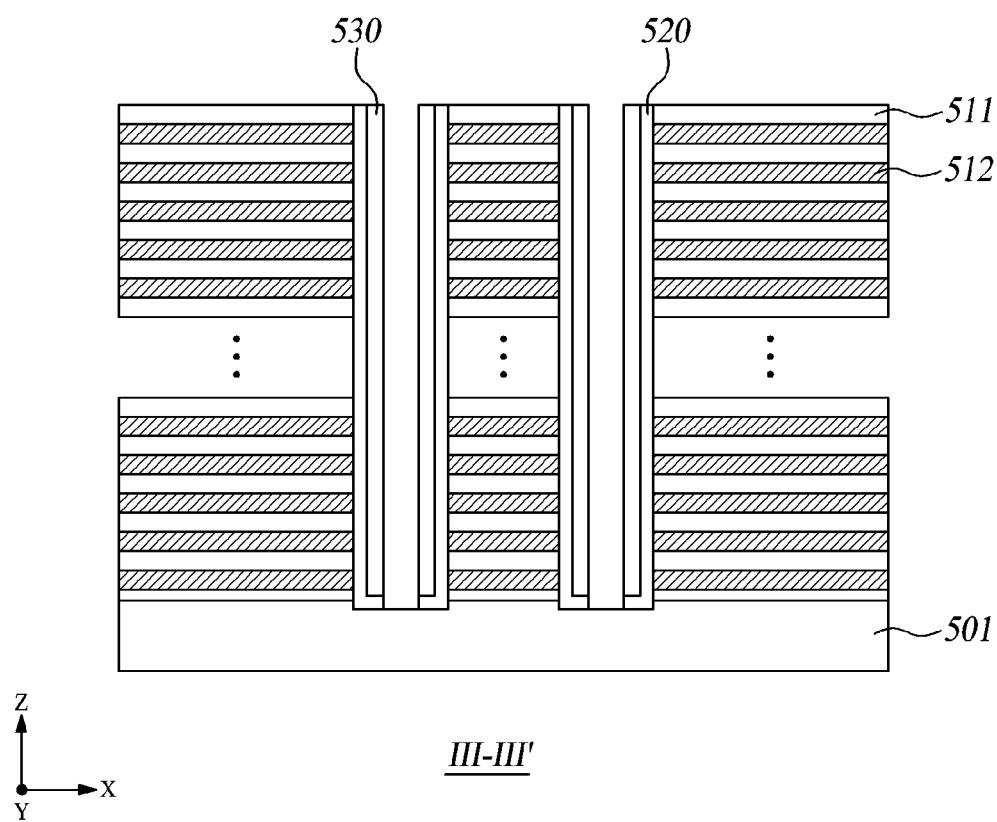

Referring to FIGS. 27 and 28, the first trench T1 may be filled with a data storage layer 520 and a dielectric layer 530. The data storage layer 520 and the dielectric layer 530 may be conformally formed on inner lower and side surfaces of the first trench T1. Thicknesses of the data storage layer 520 and the dielectric layer 530 may be equal to or different from each other. The data storage layer 520 may be formed of a ferroelectric material such as barium titanate or the like, and the dielectric layer 530 may be formed of silicon oxide or the like. Next, referring to FIGS. 29 and 30, bottom surfaces of the data storage layer 520 and the dielectric layer 530 may be etched to re-expose the upper surface of the substrate 501. By etching the bottom surfaces, the data storage layer 520 and the dielectric layer 530 may be separated from each other in the second direction, for example, an X-axis direction, in the first trench T1.

Figure 31:
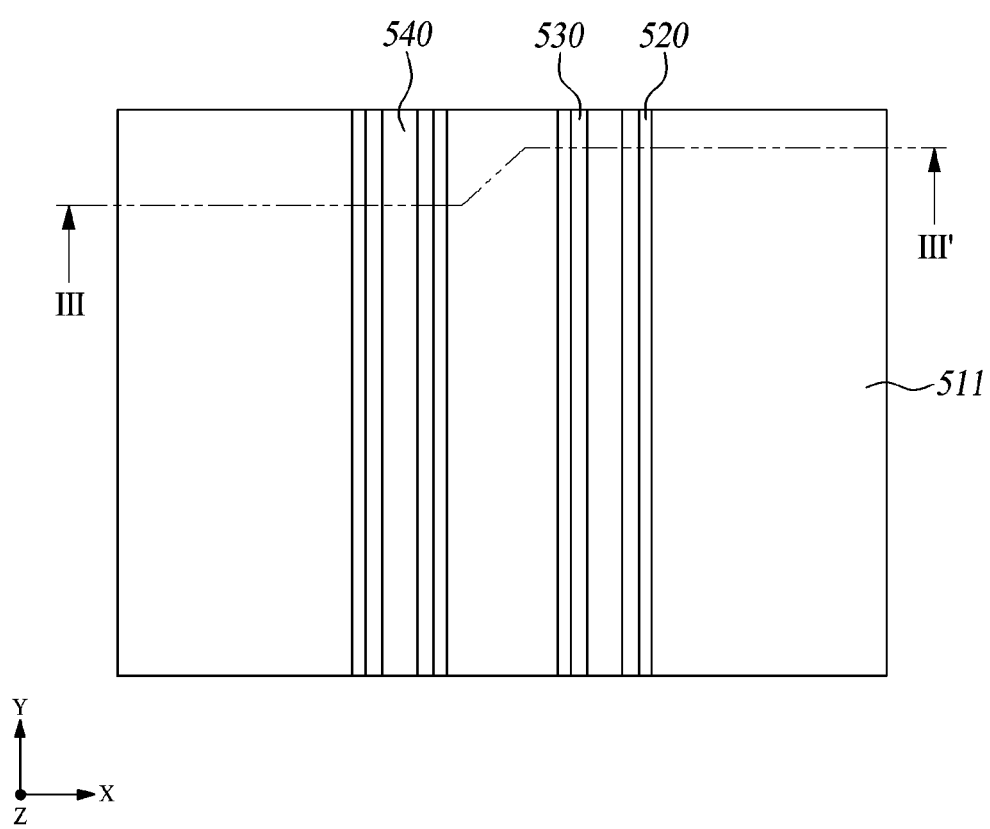
Figure 32:
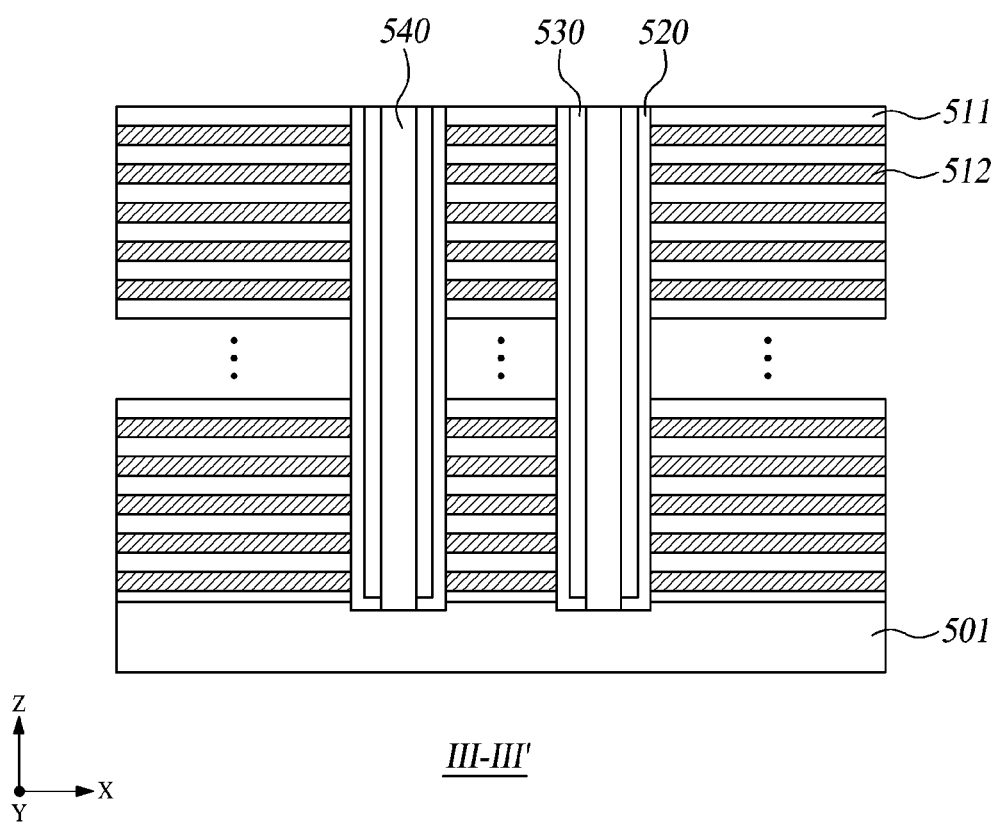

Referring to FIGS. 31 and 32, a channel region 540 may be formed by filling a gap between the dielectric layers 530 with polysilicon or the like. The channel region 540 may be formed between the dielectric layers 530, to extend in the first direction, and may contact the upper surface of the substrate 501. The term "contact," or "in contact with" as used herein refers to a direct connection (i.e., touching) unless the context indicates otherwise.

Figure 33:
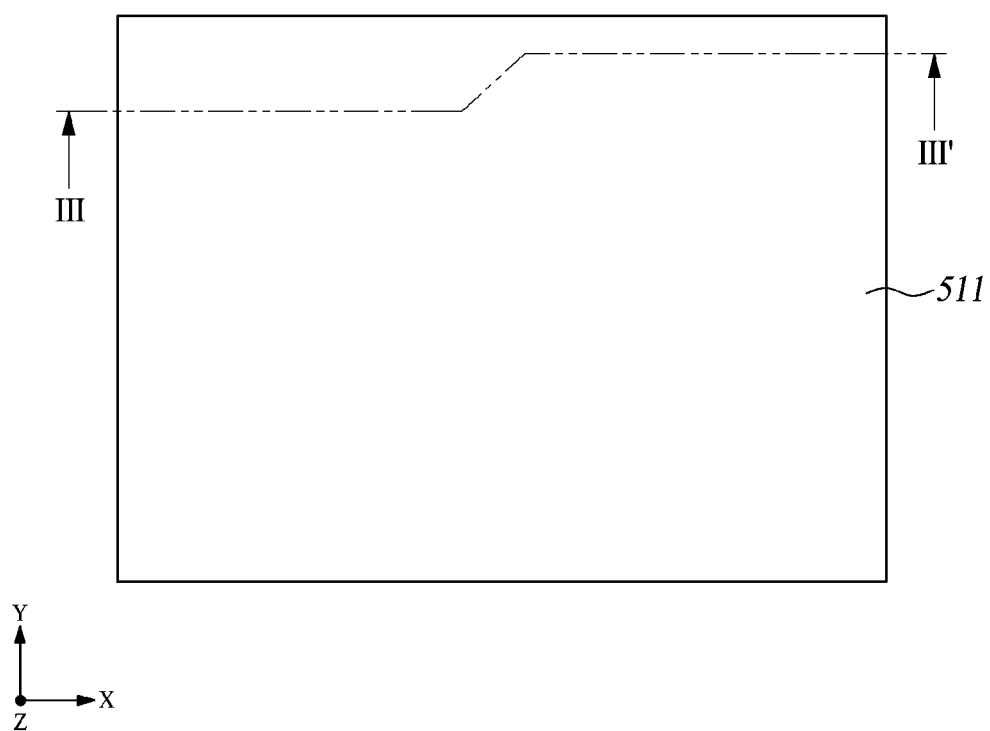
Figure 34:
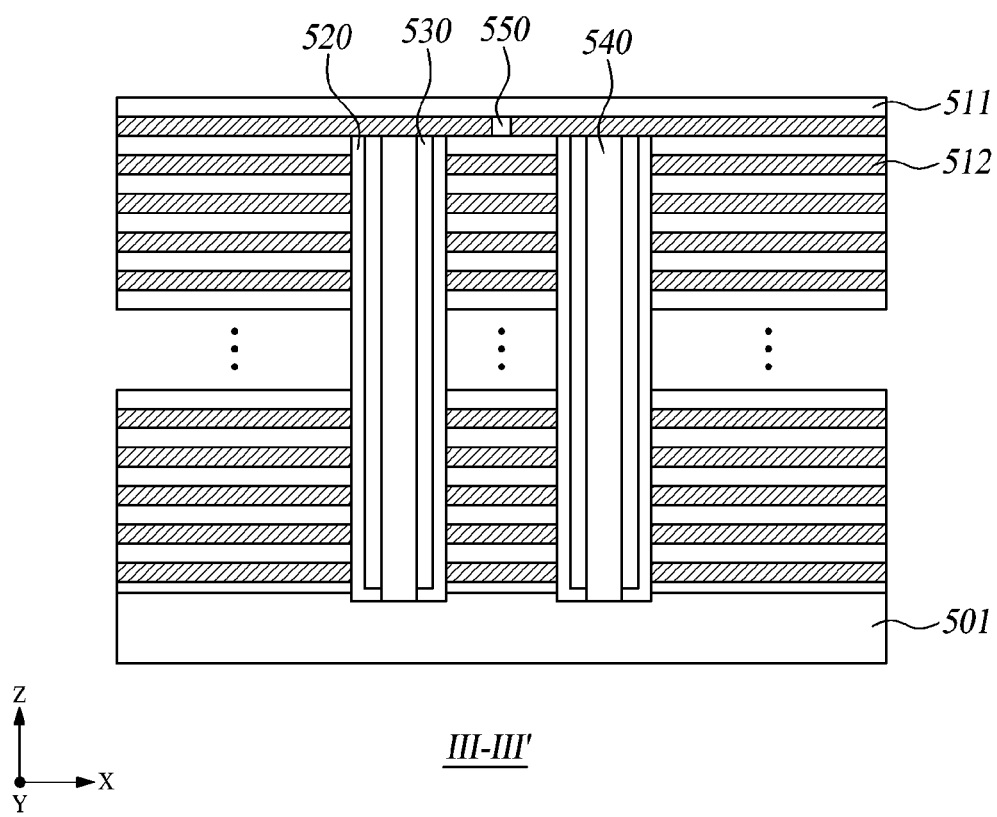
Figure 35:
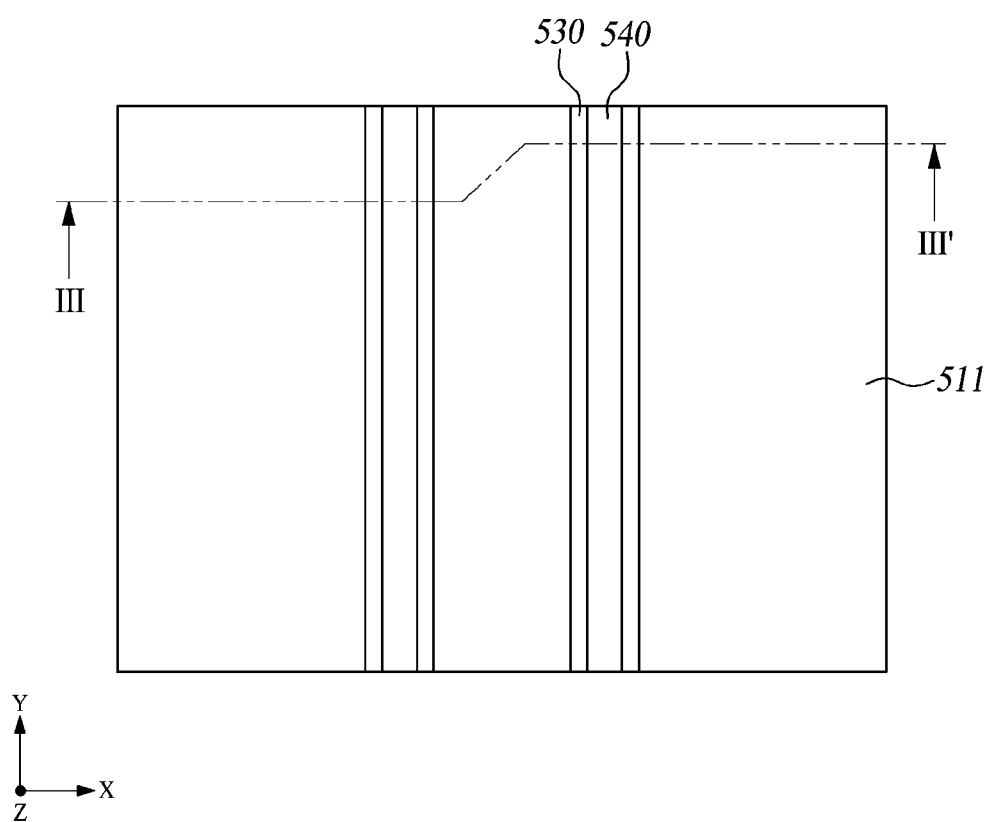
Figure 36:
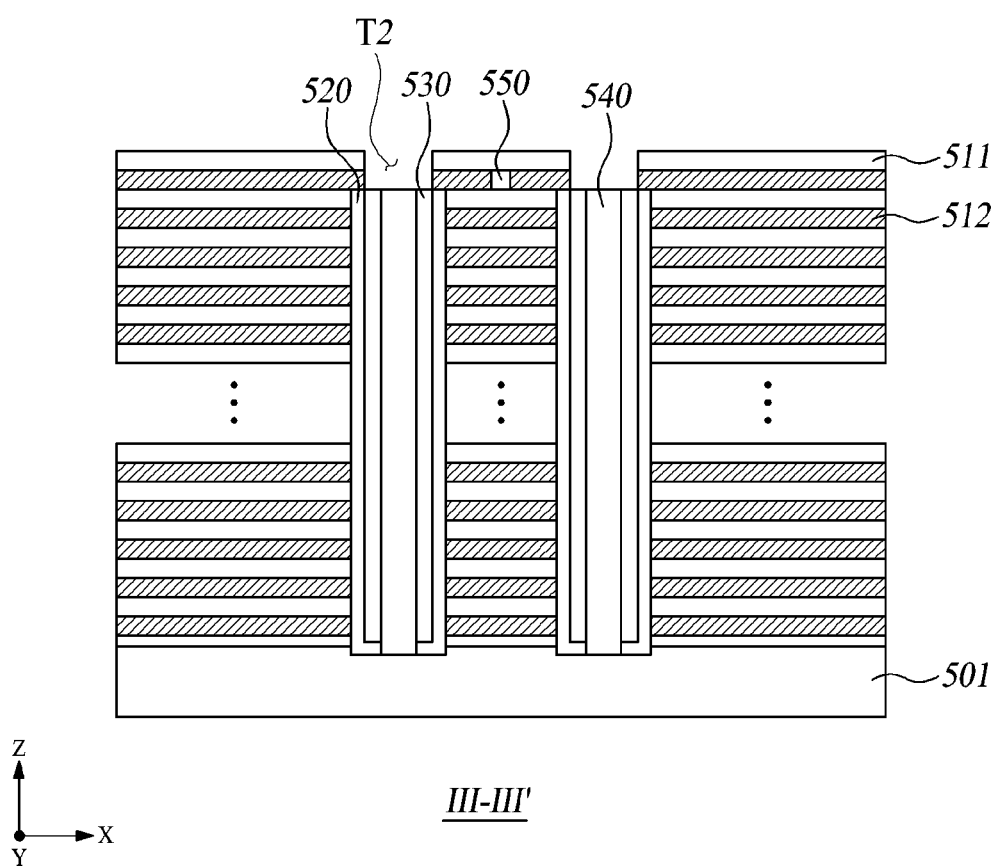

Referring to FIGS. 33 and 34, the insulating layer 511 and the gate electrode layer 512 may be additionally stacked. Although FIGS. 33 and 34 illustrate that the insulating layer 511 and the gate electrode layer 512 are additionally stacked one by one, the number of the insulating layers 511 and the gate electrode layers 512 may be variously modified. The additionally-stacked gate electrode layer 512 may be divided into a plurality of regions by a horizontal separation layer 550. Next, referring to FIGS. 35 and 36, portions of the additionally stacked insulating layer 511 and gate electrode layer 512 may be removed to form second trenches T2 exposing the channel regions 540 and the dielectric layer 530.

Figure 37:
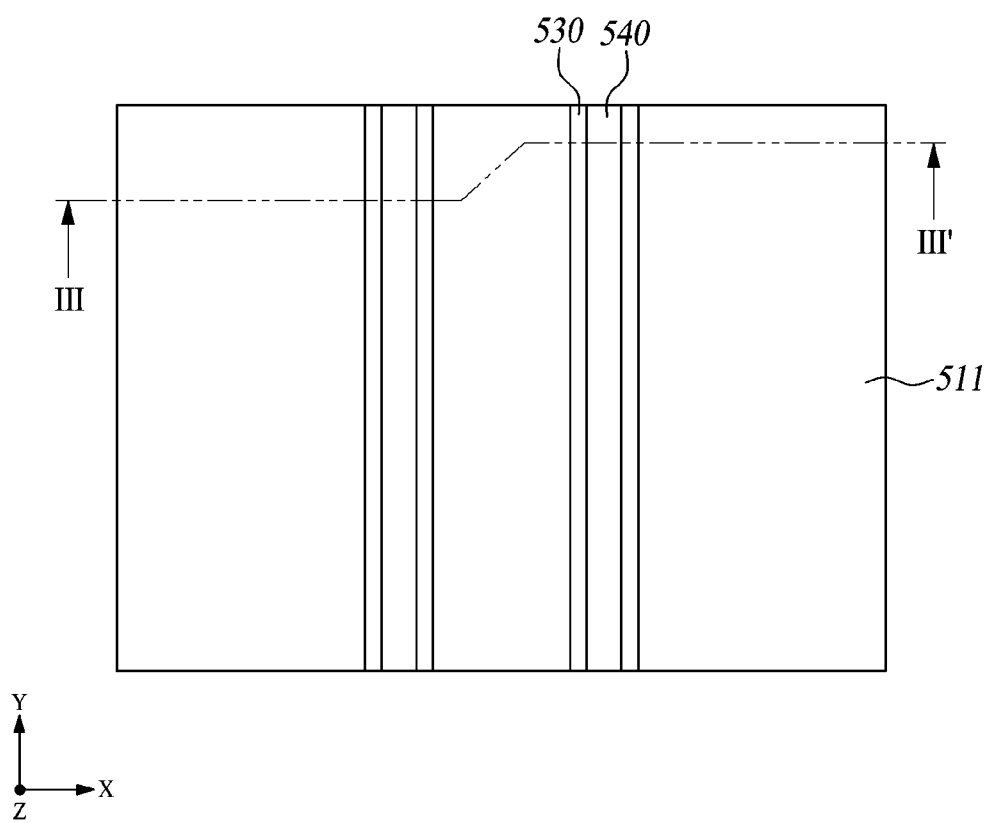
Figure 38:
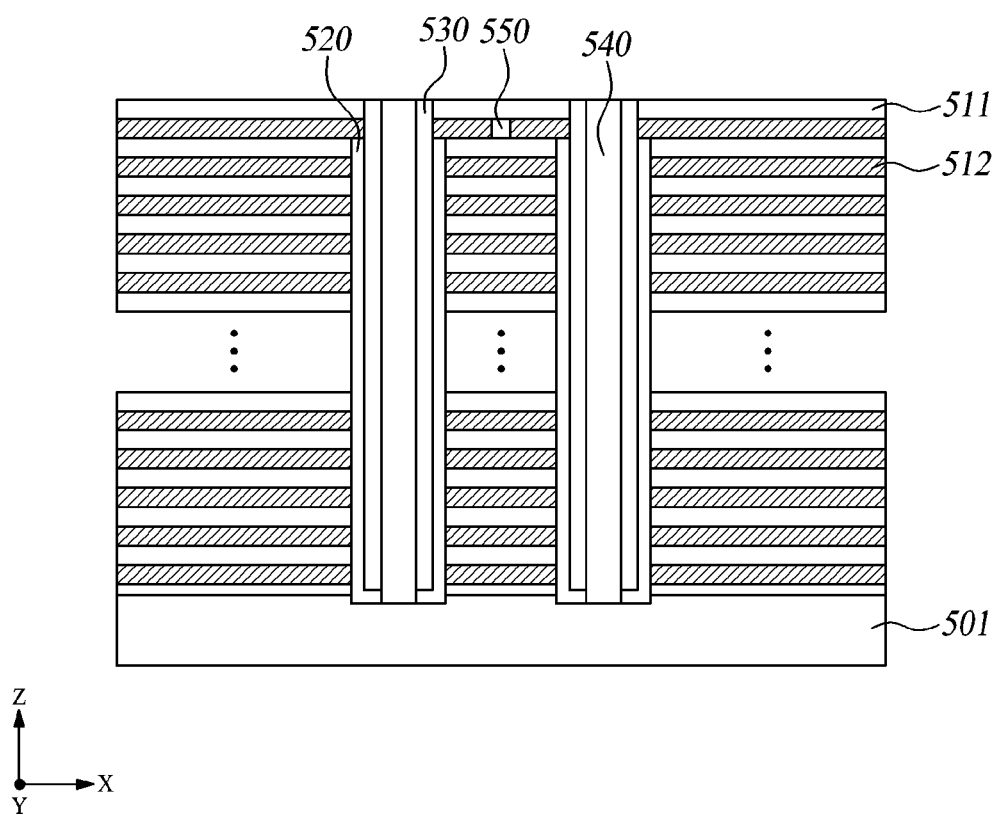

Referring to FIGS. 37 and 38, a dielectric layer 530 and a channel region 540 may be additionally formed in the second trench T2. The process illustrated in FIGS. 37 and 38 may include conformally forming the dielectric layer 530 on inner side and lower surfaces of the second trench T2, and extending the channel region 540 by removing a portion of the bottom surface of the dielectric layer 530 (e.g., a portion of the dielectric layer 530 in contact with the channel region 540 in the second trench T2) and then filling the removed portion with polysilicon or the like. Therefore, as illustrated in FIG. 38, in a third direction (a Z-axis direction), a height of the data storage layer 520 may be lower than a height of the dielectric layer 530.

Figure 39:
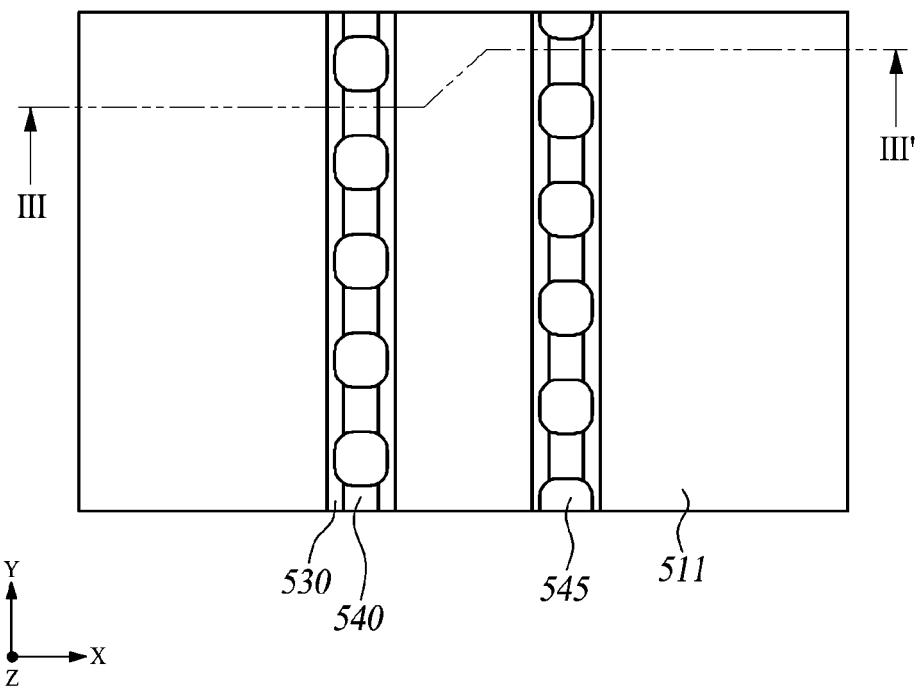

Referring to FIG. 39, a plurality of channel separation layers 545 may be formed to form a plurality of channel regions 540 separated from each other in the first direction. A width of each of the channel separation layers 545 may be greater than a width of each of the channel regions 540 in the second direction. At least a portion of the dielectric layer 530 may be removed by the channel separation layers 545, and the width of the dielectric layer 530 in the second direction may not be constant in the first direction. The channel separation layers 545 may be formed of a material such as silicon oxide, silicon nitride, or the like.

Figure 40:
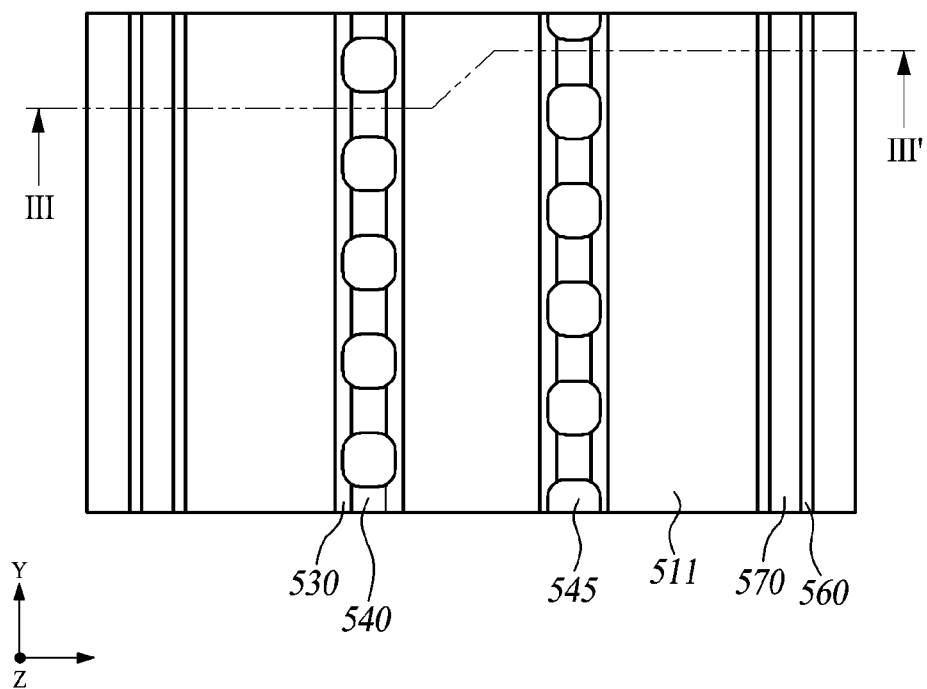
Figure 41:
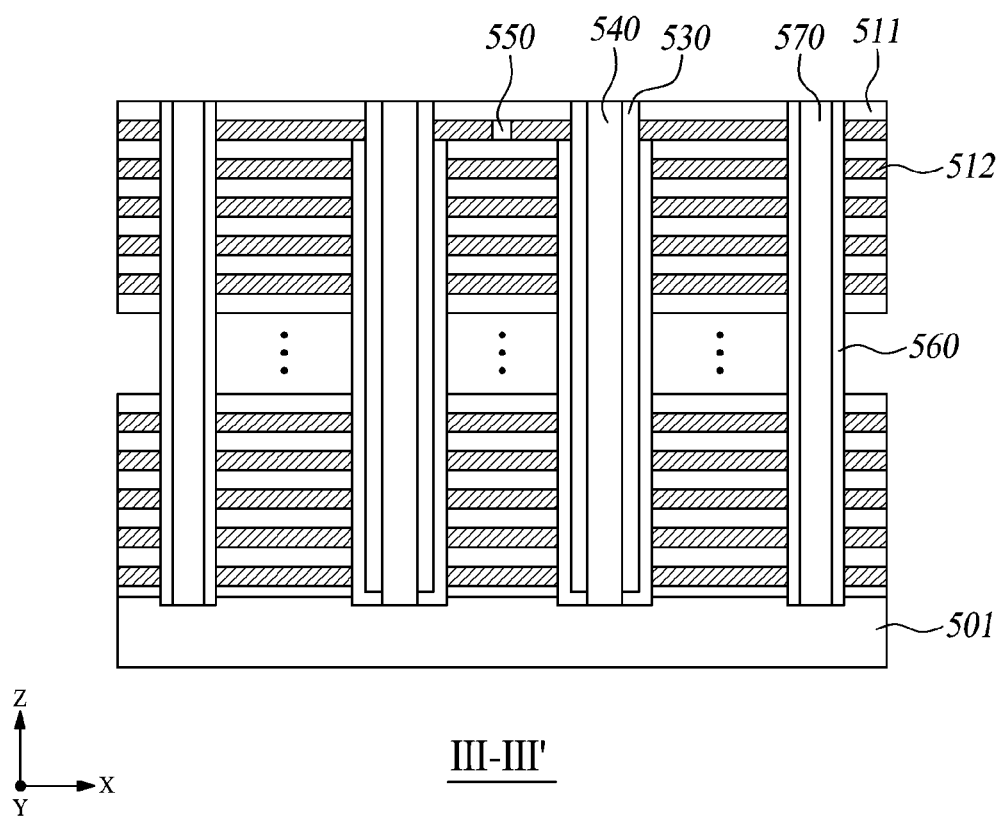

Referring to FIGS. 40 and 41, a common source line 570, and a vertical insulating layer 560 separating the common source line 570 from a plurality of gate electrode layers 512, may be formed. The common source line 570 may be connected to a source region formed in the substrate 501, and may thus be used as a path inputting a voltage to a source line while the memory device operates.

FIGS. 23 to 41 illustrate the process of manufacturing the memory device by way of example, and the structure or manufacturing process of the memory device according to example embodiments is not necessarily limited to such a manner. In an example, in a manner different from that described above with reference to FIGS. 23 to 41, the insulating layers 511 and sacrificial layers may be alternately stacked, and then, the sacrificial layers may be replaced with a metal layer or a metal oxide layer to form the gate electrode layers 512.

In the memory device according to the example embodiments described with reference to FIGS. 23 to 41, memory cell strings adjacent to each other in the second direction may share word lines. In first and second memory cell strings adjacent to each other in the second direction, a second gate of the first memory cell string and a first gate of the second memory cell string may be provided by a single word line. Therefore, the degree of integration of the memory device may be improved.

In some examples, for independent control of adjacent memory cell strings, memory cell strings adjacent to each other in the second direction may not share the word lines. In the first and second memory cell strings adjacent to each other in the second direction, the second gate of the first memory cell string and the first gate of the second memory cell string may be provided by different word lines. To this end, a process of separating the gate electrode layers, between the channel regions, in the second direction, may be added.

Figure 42:
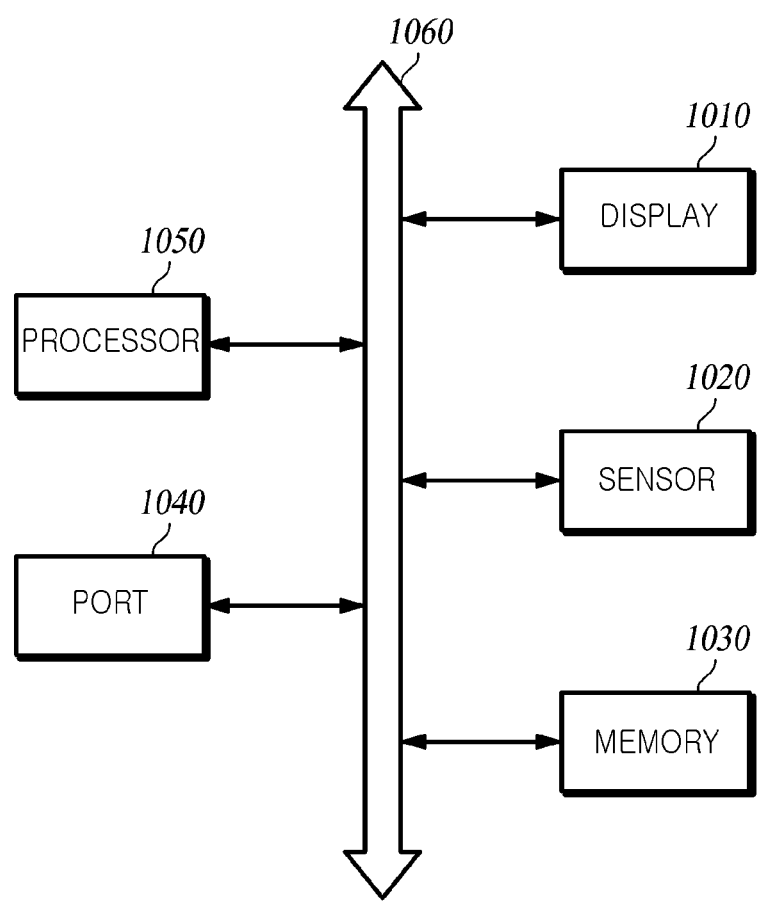
FIG. 42 is a schematic block diagram of an electronic device including a memory device according to an example embodiment of the present inventive concept.

FIG. 42 is a schematic block diagram illustrating an electronic device including a memory device according to an example embodiment.

A computer apparatus 1000 according to an example embodiment illustrated in FIG. 42 may include a display 1010, a sensor 1020, a memory 1030, a port 1040, a processor 1050, and the like. In addition, the computer apparatus 1000 may further include a wired/wireless communications device, a power supply device, and the like. Among constituent elements illustrated in FIG. 42, the port 1040 may be a device provided to allow the computer apparatus 1000 to communicate with a video card, a sound card, a memory card, a USB device, and the like. The computer apparatus 1000 may be a comprehensive concept including a smartphone, a tablet PC, a smart wearable device, and the like, as well as a general desktop computer and a laptop computer.

The processor 1050 may perform specific operations, commands, tasks, and the like. The processor 1050 may be a central processing unit (CPU) or a microprocessor unit (MCU), and may communicate with the display 1010, the sensor 1020, and the memory device 1030 via a bus and may also communicate with other devices connected to the port 1040.

The memory 1030 may be a storage medium storing data used for operations of the computer apparatus 1000, multimedia data, or the like. The memory 1030 may include a volatile memory, such as a random access memory (RAM), or a nonvolatile memory, such as a flash memory and the like. In addition, the memory 1030 may also include at least one of a solid state drive (SSD), a hard disk drive (HDD), and an optical drive (ODD), as a storage device. The memory 1030 may be implemented as a memory device that may be understood with reference to the claims, as well as a memory device that may be understood with reference to FIGS. 1 to 41 described above.

As set forth above, according to an example embodiment, memory cells may include a data storage layer formed of a ferroelectric material, and may include a first gate and a second gate electrically isolated from each other to receive different operating voltages. For example, when writing data to or reading data from a selected memory cell among memory cells sharing a channel region, since unselected memory cells may be turned on through the second gate, a phenomenon in which data of the unselected memory cells is unintentionally changed during operation may be prevented. Accordingly, since the data storage layer of a ferroelectric material may be used, an operating speed of the memory device may be increased and power consumption may be reduced.

While example embodiments have been shown and described above, it will be apparent to those skilled in the art that modifications and variations could be made without departing from the scope of the present inventive concept as defined by the appended claims.

What is claimed is:

1. A memory device comprising:
    memory cells each including a first memory cell gate, a second memory cell gate electrically isolated from the first memory cell gate, a first gate insulating layer disposed between the first memory cell gate and a channel region, and a second gate insulating layer disposed between the second memory cell gate and the channel region, wherein the first memory cell gate and the second memory cell gate share the channel region, and the first gate insulating layer includes a data storage layer having a ferroelectric material;
    a first switching cell including, a first switching cell gate and a second switching cell gate, and connected between the memory cells and a source line;
    a second switching cell including a first switching cell gate and a second switching cell gate, and connected between the memory cells and a bit line;
    for each memory cell, a channel separation layer adjacent to the channel region in a first direction, between the first memory cell gate and the second memory cell gate and having a width greater than a width of the channel region in a second direction different from the first direction; and
    a control circuit configured to control the memory cells, the first switching cell, and the second switching cell,
    wherein the channel separation layer is formed of an insulating material.

2. The memory device of claim 1, wherein the memory cells comprise first memory cells and second memory cells provided with different channel regions, and
    wherein the second memory cell gates of the first memory cells are the same gales as the first memory cell gates of the second memory cells.

3. The memory device of claim 2, wherein the second switching cell gate of the second switching cell connected to the first memory cells is separated from the first switching cell gate of the second switching cell connected to the second memory cells.

4. The memory device of claim 1, wherein the data storage layer extends along the channel region, and the data storage layer extends to at least one of the first switching cell and the second switching cell.

5. The memory device of claim 4, wherein the second gate insulating layer does not include the data storage layer.

6. The memory device of claim 1, wherein the control circuit is configured to:
    determine selected one or more memory cells and unselected memory cells among the memory cells, and
    float the first memory cell gates of the unselected memory cells and one or more respective second memory cell gates of the selected one or more memory cells, while the memory device performs a control operation on the selected one or more memory cells,
    wherein the control operation comprises at least one of a read operation, a program operation, and an erase operation.

7. The memory device of claim 6, wherein, in the read operation, the control circuit is configured to apply a read voltage to the first memory cell gates of the selected one or more memory cells and apply a pass voltage to the second memory cell gates of the unselected memory cells to turn on the unselected memory cells, and
    wherein the read voltage is a voltage increasing from a first voltage to a second voltage, the second voltage being higher than the first voltage.

8. The memory device of claim 6, wherein, in the program operation, the control circuit is configured to apply a program voltage to the first memory cell gates of the selected one or more memory cells and apply a pass voltage to the second memory cell gates of the unselected memory cells to turn on the unselected memory cells.

9. The memory device of claim 8, wherein the program voltage is equal to or higher than a predetermined reference voltage, the predetermined reference voltage being a voltage changing a dipole polarity of the data storage layer of the selected one or more cells.

10. A memory device comprising:
    memory cells each including a first gate and a second gate separated from each other;
    a first switching cell connected between the memory cells and a source line, the first switching cell including a first gate and a second gate;
    a second switching cell connected between the memory cells and a bit line, the second switching cell including a first gate and a second gate;
    a data storage layer having a ferroelectric material disposed between the first gates of the memory cells and a channel region and not disposed between the channel region and the first gate of at least one of the first switching cell and the second switching cell; and
    a control circuit configured to:
    determine at least one selected memory cell and unselected memory cells among the memory cells, and
    float the first gates of the unselected memory cells and the second gate of the at least one selected memory cell in a control operation with respect to the at least one selected memory cell,
    wherein the control circuit is further configured to a pt, a program voltage to the first gate of the at least one selected memory cell and a pass voltage to the second gates of the unselected memory cells to boost the channel region of at least a portion of the memory cells, in a program operation of writing data to the at least one selected memory cell.

11. The memory device of claim 10, wherein the control circuit is configured to apply a read voltage to the first gate of the at least one selected memory cell and a pass voltage to the second gates of the unselected memory cells to turn on the unselected memory cells, in a read operation to read data from the at least one selected memory cell.

12. The memory device of claim 11, wherein the control circuit is configured to provide a current path in a channel region shared by the memory cells in response to the applying of the read voltage and the pass voltage.

13. The memory device of claim 10, wherein the data storage layer is not disposed between the second gates of the memory cells and the channel region.

14. A memory device comprising:
    first word lines extending in a first direction parallel to an upper surface of a substrate and stacked on the upper surface of the substrate in a third direction perpendicular to the upper surface of the substrate;
    second word lines stacked on the upper surface of the substrate in the third direction and separated from the first word lines in a second direction parallel to the upper surface of the substrate;
    channel regions disposed between the first word lines and the second word lines and extending in the third direction;
    a first gate insulating layer including a data storage layer having a ferroelectric material disposed between a first channel region of the channel regions and the first word lines and the first gate insulating layer extending in the first direction; and a second gate insulating layer extending in the first direction between the first channel region and the second word lines and having a material different from the ferroelectric material, wherein two channel regions of the channel regions, the two channel regions adjacent to each other are separated by a channel separation layer in the first direction.

15. The memory device of claim 14, wherein the first gate insulating layer comprises the data storage layer and a dielectric layer formed of a material different from a material of the data storage layer.

16. The memory device of claim 15, wherein a height of the data storage layer is different from a height of the dielectric layer in a direction perpendicular to the upper surface of the substrate.

17. The memory device of claim 14, wherein the first gate insulating layer and the second gate insulating layer have different structures.

18. The memory device of claim 14, further comprising:
a string select line stacked above the first word lines and extending in the first direction; and
a ground select line stacked under the first word lines and extending in the first direction,
wherein the data storage layer is not disposed between either the string select line or the ground select line and the first channel region.

* * * * *